US012219774B2

(12) United States Patent
Lee et al.

(10) Patent No.: US 12,219,774 B2
(45) Date of Patent: Feb. 4, 2025

(54) NONVOLATILE MEMORY CHIP AND SEMICONDUCTOR PACKAGE INCLUDING THE SAME

(71) Applicant: SAMSUNG ELECTRONICS CO., LTD., Suwon-si (KR)

(72) Inventors: Min Jae Lee, Suwon-si (KR); Jin Do Byun, Suwon-si (KR); Young-Hoon Son, Yongin-si (KR); Young Don Choi, Seoul (KR); Pan Suk Kwak, Seoul (KR); Myung Hun Lee, Seongnam-si (KR); Jung Hwan Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 629 days.

(21) Appl. No.: 17/443,448

(22) Filed: Jul. 26, 2021

(65) Prior Publication Data

US 2022/0157845 A1 May 19, 2022

(30) Foreign Application Priority Data

Nov. 18, 2020 (KR) ........................ 10-2020-0154629

(51) Int. Cl.
*H10B 43/40* (2023.01)
*G11C 16/08* (2006.01)
*H01L 23/522* (2006.01)
*H01L 23/528* (2006.01)
*H10B 41/10* (2023.01)
*H10B 41/27* (2023.01)
*H10B 41/40* (2023.01)
(Continued)

(52) U.S. Cl.
CPC ............. *H10B 43/40* (2023.02); *G11C 16/08* (2013.01); *H01L 23/5226* (2013.01);
(Continued)

(58) Field of Classification Search
CPC ............ G11C 16/08; H01L 2224/0235; H01L 2224/02372; H01L 2224/02375;
(Continued)

(56) References Cited

U.S. PATENT DOCUMENTS 9,515,083 B2   12/2016 Lee et al.
9,691,782 B1 *  6/2017 Hwang ................ H10B 43/40
(Continued)

OTHER PUBLICATIONS

Extended European Search Report Dated Apr. 4, 2022 for European Application No. 21201840.2.
(Continued)

*Primary Examiner* — Herve-Louis Y Assouman
*Assistant Examiner* — Linda J. Fleck
(74) *Attorney, Agent, or Firm* — F. CHAU & ASSOCIATES, LLC

(57) ABSTRACT

A non-volatile memory chip comprises a cell region that includes a first surface, a second surface opposite to the first surface, a first cell structure, and a second cell structure spaced apart from the first cell structure; a peripheral circuit region on the first surface of the cell region, and that includes a first peripheral circuit connected to the first cell structure, a second peripheral circuit connected to the second cell structure, and a connection circuit between the first and second peripheral circuits; a through via between the first and second cell structures and that extends from the second surface of the cell region to the connection circuit of the peripheral circuit region; a redistribution layer that covers the through via on the second surface of the cell region, is connected to the through via, and extends along the second surface; and a chip pad connected to the redistribution layer.

20 Claims, 25 Drawing Sheets

(51) Int. Cl.
H10B 43/10 (2023.01)
H10B 43/27 (2023.01)

(52) U.S. Cl.
CPC ......... H01L 23/5283 (2013.01); H10B 41/10 (2023.02); H10B 41/27 (2023.02); H10B 41/40 (2023.02); H10B 43/10 (2023.02); H10B 43/27 (2023.02)

(58) Field of Classification Search
CPC . H01L 2224/02379; H01L 2224/04042; H01L 2224/05569; H01L 2224/08145; H01L 2224/32145; H01L 2224/33181; H01L 2224/48145; H01L 2224/48227; H01L 2224/49175; H01L 2224/73215; H01L 2224/73251; H01L 2224/73265; H01L 2224/80895; H01L 2225/06506; H01L 2225/0651; H01L 2225/06527; H01L 2225/06562; H01L 23/481; H01L 23/49838; H01L 23/5226; H01L 23/525; H01L 23/528; H01L 23/5283; H01L 24/02; H01L 24/05; H01L 24/06; H01L 24/09; H01L 25/0657; H10B 41/10; H10B 41/27; H10B 41/40; H10B 43/10; H10B 43/27; H10B 43/35; H10B 43/40; H10B 43/50; H10B 69/00
See application file for complete search history.

(56) References Cited

U.S. PATENT DOCUMENTS

| | | | |
|---|---|---|---|
| 9,799,672 B2 * | 10/2017 | Son | H01L 25/0657 |
| 9,865,541 B2 | 1/2018 | Kim et al. | |
| 10,381,374 B2 | 8/2019 | Tagami et al. | |
| 10,548,814 B2 | 1/2020 | Tak et al. | |
| 10,573,669 B2 | 2/2020 | Oh et al. | |
| 10,629,616 B1 | 4/2020 | Kai et al. | |
| 10,644,019 B2 | 5/2020 | Shin et al. | |
| 10,672,779 B2 | 6/2020 | Shimojo | |
| 11,456,335 B2 * | 9/2022 | Lim | H10B 43/40 |
| 2011/0204309 A1 * | 8/2011 | Nitta | H01L 27/101 |
| | | | 257/E45.001 |
| 2017/0069369 A1 | 3/2017 | Kim et al. | |
| 2017/0179027 A1 * | 6/2017 | Kim | H10B 43/40 |
| 2017/0263618 A1 * | 9/2017 | Shimojo | H10B 41/40 |
| 2018/0122741 A1 * | 5/2018 | Cho | H01L 23/53295 |
| 2018/0254247 A1 * | 9/2018 | Kim | H10B 41/42 |
| 2019/0043868 A1 * | 2/2019 | Hasnat | H01L 21/185 |
| 2019/0088676 A1 * | 3/2019 | Tagami | H01L 23/5226 |
| 2019/0164991 A1 * | 5/2019 | Lim | G11C 16/0483 |
| 2019/0198513 A1 * | 6/2019 | Park | H10B 43/35 |
| 2020/0066742 A1 | 2/2020 | Kim et al. | |
| 2020/0144242 A1 | 5/2020 | Park | |
| 2020/0152573 A1 | 5/2020 | Oh et al. | |
| 2021/0043639 A1 * | 2/2021 | Yun | G11C 5/025 |
| 2021/0159242 A1 * | 5/2021 | Jang | H10B 43/35 |
| 2021/0210475 A1 * | 7/2021 | Sung | H01L 24/08 |
| 2021/0295899 A1 * | 9/2021 | Watanabe | G11C 5/06 |
| 2022/0084910 A1 * | 3/2022 | Karyu | H10B 43/10 |
| 2022/0115344 A1 * | 4/2022 | Kim | H01L 24/80 |
| 2022/0336436 A1 * | 10/2022 | Zhang | H10B 43/40 |

OTHER PUBLICATIONS

European Office Action Dated May 16, 2022 for European Application No. 21201840.2.

* cited by examiner

NONVOLATILE MEMORY CHIP AND SEMICONDUCTOR PACKAGE INCLUDING THE SAME

This application claims priority under 35 U.S.C. § 119 from Korean Patent Application No. 10-2020-0154629, filed on Nov. 18, 2020 in the Korean Intellectual Property Office, the contents of which are herein incorporated by reference in their entirety.

BACKGROUND

1. Technical Field

Embodiments of the present disclosure are directed to a non-volatile memory chip and a semiconductor package that includes the non-volatile memory chip.

2. Discussion of the Related Art

Semiconductor memory devices include volatile memory devices and non-volatile memory devices. A volatile memory device has fast read and write speeds, but on the other hand, a volatile memory device loses stored contents when powered off. On the other hand, since a non-volatile memory device retains the stored contents even when powered off, a non-volatile memory device is used to store contents that need to be preserved, regardless of power supply.

Examples of volatile memory devices include a static RAM (SRAM), a dynamic RAM (DRAM), a synchronous DRAM (SDRAM), etc. Non-volatile memory devices retain the stored contents even when powered off. Examples of non-volatile memory devices include a read only memory (ROM), a programmable ROM (PROM), an electrically programmable ROM (EPROM), electrically erasable and programmable ROM (EEPROM), a flash memory, a phase change RAM (PRAM), a magnetic RAM (MRAM), a resistive RAM (RRAM), a ferroelectric RAM (FRAM), etc. A flash memory may be classified as a NOR type flash memory or a NAND type flash memory.

In particular, a flash memory device can be implemented as a highly integrated auxiliary large capacity storage device, etc., as compared to a general EEPROM.

A flash memory device may include a plurality of flash memories. A plurality of flash memories are mounted on a package substrate, and the chip pads of the respective flash memories are connected to the package substrate through a connector.

SUMMARY

Embodiments of the present disclosure provide a non-volatile memory chip in which power consumption is reduced and a chip size is reduced.

Embodiments of the present disclosure also provide a semiconductor package in which power consumption is reduced and the chip size is reduced.

According to an embodiment of the present disclosure, a non-volatile memory chip includes a cell region that includes a first surface, a second surface opposite to the first surface, a first cell structure, and a second cell structure spaced apart from the first cell structure; a peripheral circuit region placed on the first surface of the cell region and that includes a first peripheral circuit connected to the first cell structure, a second peripheral circuit spaced apart from the first peripheral circuit and connected to the second cell structure, and a connection circuit placed between the first and second peripheral circuits therein; a through via between the first and second cell structures and that extends from the second surface of the cell region to the connection circuit of the peripheral circuit region; a redistribution layer that covers the through via on the second surface of the cell region, is connected to the through via, and extends along the second surface; and a chip pad connected to the redistribution layer.

According to other embodiments of the present disclosure, a non-volatile memory chip includes a first region that extends in a first direction; a second region that is spaced apart in a second direction from the first region, where the second direction differs from the first direction; a cell structure placed in second region of the non-volatile memory chip; a peripheral circuit placed in the second region of the non-volatile memory chip and connected to the cell structure; a connection circuit placed in the first region of the non-volatile memory chip and connected to the peripheral circuit; a through via placed in first region of the non-volatile memory chip, extends from an upper surface of the non-volatile memory chip to the peripheral circuit, and is connected to the peripheral circuit; a redistribution layer connected to the through via in the first region and that extends along the upper surface of the second region of the non-volatile memory chip; and a chip pad connected to the redistribution layer in the second region.

According to other embodiments of the present disclosure, a non-volatile memory chip includes a cell region that includes a first surface, a second surface opposite to the first surface, and a cell structure that includes a stair structure; a peripheral circuit region placed on the first surface of the cell region and that includes a peripheral circuit; a through via that extends from the second surface of the cell region and penetrates the cell structure and connects to the peripheral circuit; a redistribution layer that extends along the second surface of the cell region, wherein a first end of the redistribution layer covers the through via and is connected to the through via; and a chip pad that is connected to the redistribution layer and does not overlap the through via.

According to other embodiments of the present disclosure, a semiconductor package includes a package substrate that includes a package pad; a first non-volatile memory chip disposed on the package substrate; and a second non-volatile memory chip disposed on the first non-volatile memory chip. The first non-volatile memory chip includes a first cell region that includes a first surface, a second surface opposite to the first surface, and a first cell structure that includes a stair structure; a first peripheral circuit region disposed on the first surface and that includes a first peripheral circuit; a first through via that extends from the second surface, penetrates the first cell structure and is connected to the first peripheral circuit; a first redistribution layer that is connected to the first through via and that extends along the second surface and covers the first cell structure; and a first chip pad connected to the first redistribution layer. The second non-volatile memory chip includes a second cell region that includes a third surface, a fourth surface opposite to the third surface, and a second cell structure that includes a stair structure; a second peripheral circuit region disposed on the third surface and that includes a second peripheral circuit; a second through via that extends from the fourth surface, penetrates the second cell structure and is connected to the second peripheral circuit; a second redistribution layer that is connected to the second through via, extends along the fourth surface and covers the second cell structure; and a second chip pad connected to the second redistribution layer. The first chip pad and the second chip pad are connected to the package pad of the package substrate.

DETAILED DESCRIPTION OF EMBODIMENTS

Hereinafter, embodiments according to the technical idea of the present disclosure will be described referring to the accompanying drawings.

Hereinafter, an electronic device 1 that includes a host 100, a memory controller 200, and a non-volatile memory 300 will be described with reference to FIGS. 1 to 12.

Figure 1:
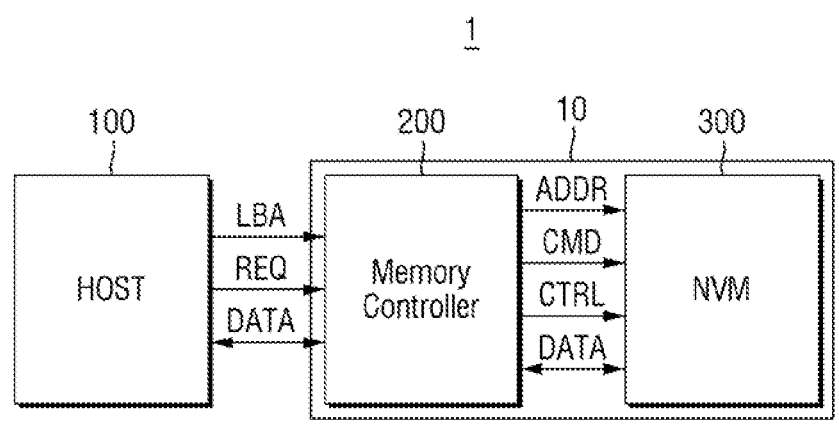
FIG. 1 is a block diagram that illustrates an electronic device according to some embodiments.
Figure 2:
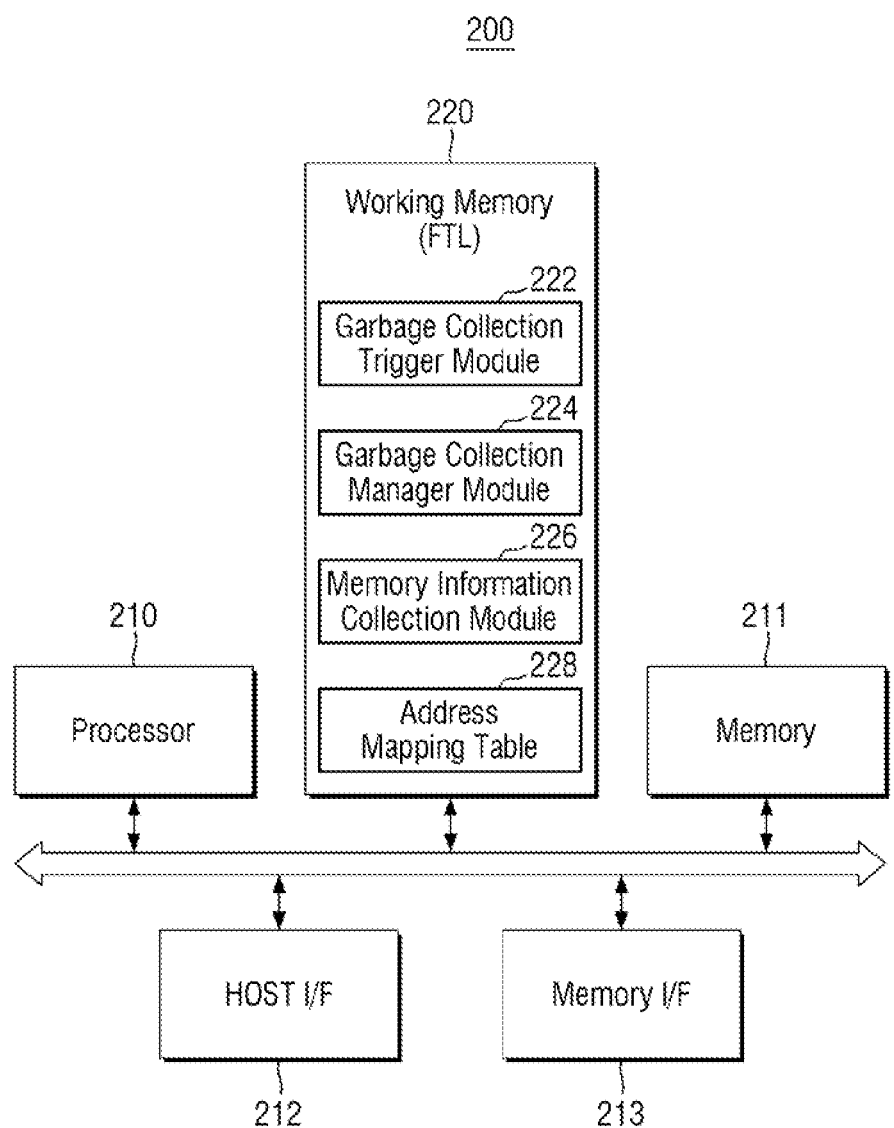
FIG. 2 is a block diagram that illustrates a memory controller of FIG. 1.
Figure 3:
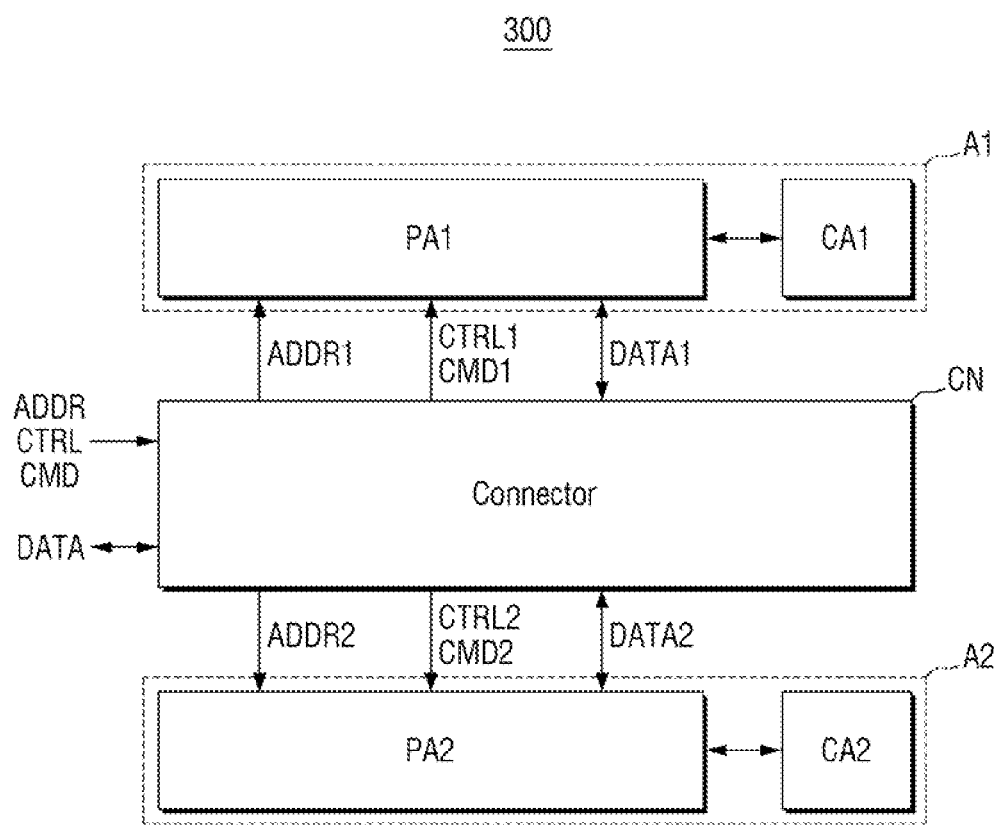
FIGS. 3 and 4 are block diagrams that illustrates a non-volatile memory of FIG. 1.
Figure 4:
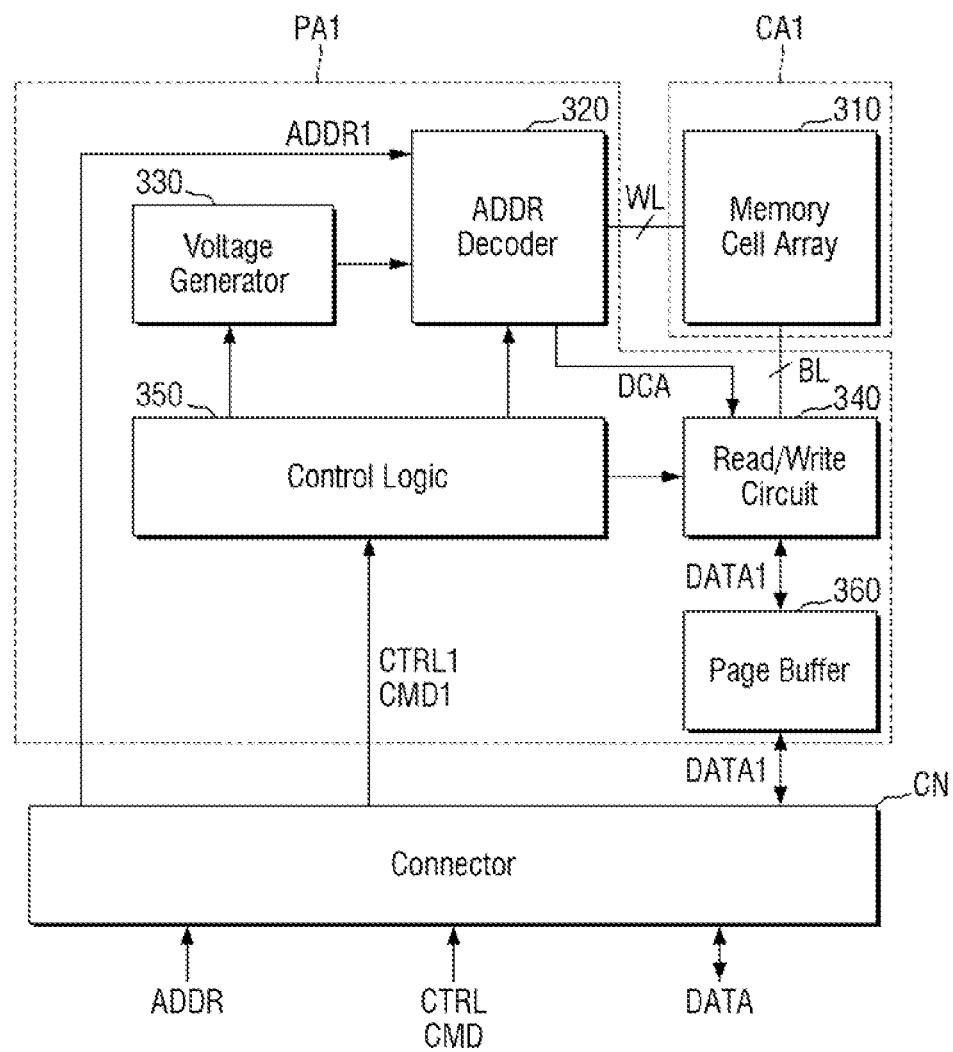

FIG. 1 is a block diagram that illustrates an electronic device according to some embodiments. FIG. 2 is a block diagram of the memory controller of FIG. 1. FIGS. 3 and 4 are block diagrams of the non-volatile memory of FIG. 1.

Referring to FIG. 1, in an embodiment, the electronic device 1 includes a host 100 and a memory storage device 10. The host 100 and the memory storage device 10 are electrically connected to each other. The host 100 provides the memory storage device 10 with a logical block address (LBA) and a request signal (REQ), and the host 100 and the memory storage device 10 send and receive data (DATA). For example, the host 100 is connected to the memory controller 200.

The host 100 may include, for example, a PC (personal computer), a laptop, a mobile phone, a smart phone, a tablet PC, etc.

In an embodiment, the memory storage device 10 includes a memory controller 200 and a non-volatile memory 300. The memory storage device 10 may be integrated into a single semiconductor device. For example, the memory storage device 10 may be an embedded UFS (Universal Flash Storage) memory device, an eMMC (embedded Multi-Media Card), an SSD (Solid State Drive), etc. Further, for example, the memory storage device 10 may be a detachable UFS memory card, a CF (Compact Flash), a SD (Secure Digital), a Micro-SD (Micro Secure Digital), a Mini-SD (Mini Secure Digital), an xD (Extreme Digital), a memory stick, etc.

In an embodiment, the non-volatile memory 300 includes a NAND flash memory. However, embodiments of the present disclosure are not limited thereto, and the non-volatile memory 300 may include a NOR flash memory, or may include a resistive memory, such as a PRAM (Phase-change RAM), a MRAM (Magneto resistive RAM), a FeRAM (Ferroelectric RAM), or a RRAM (Resistive RAM).

In an embodiment, the memory controller 200 is connected to the non-volatile memory 300 to control the non-volatile memory 300. For example, the memory controller 200 provides an address ADDR, a command CMD, a control signal CTRL, etc., to the non-volatile memory 300 in response to a logical block address LBA, a request signal REQ, etc., received from the host 100. That is, the memory controller 200 provides signals to the non-volatile memory 300, and controls the non-volatile memory 300 to write data to the non-volatile memory 300 or read data from the non-volatile memory 300. Further, the memory controller 200 and the non-volatile memory 300 can send and receive data DATA.

Referring to FIG. 2, in an embodiment, the memory controller 200 includes a processor 210, a memory 211, a host interface 212, a memory interface 213, and a working memory 220.

The processor 210 may include a central processing unit (CPU), a controller, an application specific integrated circuit (ASIC), etc. In an embodiment, the processor 210 controls the overall operation of the memory controller 200. The processor 210 drives the firmware loaded into the working memory 220 to control the memory controller 200.

In an embodiment, the memory 211 stores code data required for the initial booting of the memory storage device 10.

In an embodiment, the memory controller 200 and the host 100 are connected through the host interface 212. That is, data DATA can be sent and received through the host interface 212. The host interface 212 may be an ATA (advanced technology attachment), a SATA (serial ATA), an e-SATA (external SATA), a USB (universal serial bus), etc.

In an embodiment, the memory controller 200 and the non-volatile memory 300 are connected through the memory interface 213. That is, the data DATA, the control signal CTRL, the address ADDR, the command CMD, etc., are transmitted and received through the memory interface 213. The working memory 220 can be implemented as a cache memory, a DRAM, a SRAM, a flash memory, etc.

In an embodiment, the working memory 220 includes a flash transition layer (FTL). The flash transition layer includes system software that manages operations such as a write, a read and an erasure of the non-volatile memory 300. For example, the flash transition layer includes firmware. The flash transition layer is loaded into the working memory 220. The firmware of the flash transition layer is executed by the processor 210.

In an embodiment, the working memory 220 includes a garbage collection trigger module 222, a garbage collection manager module 224, a memory information collection module 226, and an address mapping table 228.

In an embodiment, the working memory 220 converts the logical block address LBA into the address ADDR by using the address mapping table 228, and provides the address ADDR to the non-volatile memory 300. The working memory 220 manages the memory cells of the non-volatile memory 300. For example, the working memory 220 performs garbage collection and bad block management operations on the blocks of the memory cell array 310 of the non-volatile memory 300.

In an embodiment, the memory controller 200 controls the garbage collection of the non-volatile memory 300 using the garbage collection trigger module 222, the garbage collection manager module 224, etc. For example, the garbage collection trigger module 222 provides a garbage collection trigger signal to the garbage collection manager module 224 in response to a garbage collection request. For example, the garbage collection manager module 224 controls the garbage collection of the non-volatile memory 300 using metadata, etc.

Referring to FIG. 3, the non-volatile memory 300 according to an embodiment includes a connector CN, a first region A1, and a second region A2.

In an embodiment, the connector CN receives the address ADDR, the control signal CTRL, the command CMD, the data DATA, etc., from the memory controller 200. For example, the connector CN is connected through the memory interface 213 of the memory controller 200.

In an embodiment, the connector CN is connected to the first region A1 and the second region A2. The connector CN provides a first address ADDR1, a first control signal CTRL1 and a first command CMD1 to the first region A1, and can send or receive the first data DATA1 to or from the first region A1. Specifically, the connector CN is connected to a first peripheral circuit region PA1 of the first region A1 to transmit or receive signals. The connector CN provides a second address ADDR2, a second control signal CTRL2, and a second command CMD2 to the second region A2, and can send or receive the second data DATA2 to or from the second region A2. Specifically, the connector CN is connected to a second peripheral circuit region PA2 of the second region A2 to transmit or receive signals.

In an embodiment, the connector CN includes a connection circuit. That is, the connection circuit of the connector CN operates as an interface between the first region A1 and the memory controller 200, and also operates as an interface between the second region A2 and the memory controller 200. The components of the non-volatile memory 300 are divided into the first region A1 and the second region A2. However, embodiments according to the technical idea of the present disclosure are not limited thereto, and in other embodiments, the non-volatile memory 300 has a single component region.

In an embodiment, the first region A1 includes a first cell region CA1 and the first peripheral circuit region PA1, and the second region A2 includes a second cell region CA2 and the second peripheral circuit region PA2. The first cell region CA1 and the first peripheral circuit region PA1 send or receive signals to or from each other, and the second cell region CA2 and the second peripheral circuit region PA2 also send or receive signals to or from each other. A more detailed configuration of the first region A1 and the second region A2 will be described below. In an embodiment, the configuration of the second region A2 is substantially the same as the configuration of the first region A1.

Referring to FIG. 4, in an embodiment, the first region A1 includes the first cell region CA1 and the first peripheral circuit region PA1. The first cell region CA1 includes a memory cell array 310, and the first peripheral circuit region PA1 includes an address decoder 320, a voltage generator 330, a read/write circuit 340, a control logic 350, a page buffer 360, etc. However, embodiments according to the technical idea of the present disclosure are not limited to the configuration shown in FIG. 4.

In an embodiment, the memory cell array 310 is connected to the address decoder 320 through word lines WL. The memory cell array 310 is connected to the read/write circuit 340 through bit lines BL. The memory cell array 310 includes a plurality of memory cells. For example, the memory cells placed in a row direction are connected to the word line WL, and the memory cells placed in a column direction are connected to the bit line BL.

In an embodiment, the address decoder 320 is connected to the memory cell array 310 through the word line WL. The address decoder 320 operates under the control of the control logic 350. The address decoder 320 receives the address ADDR1 from the connector CN. The address decoder 320 receives the voltage required for its operations, such as a program or a read, from the voltage generator 330.

In an embodiment, the address decoder 320 decodes the row address from the received address ADDR1. The address decoder 320 selects the word line WL using the decoded row address. A decoded column address DCA is provided to the read/write circuit 340. For example, the address decoder 320 includes a row decoder, a column decoder, an address buffer, etc.

In an embodiment, the voltage generator 330 generates the voltage required for the access operation under the control of the control logic 350. For example, the voltage generator 330 generates the program voltage and program verification voltage required to perform the program operation. For example, the voltage generator 330 generates the read voltages required to perform the read operation, the erase voltage and the erase verification voltage required to perform the erase operation, etc. In addition, the voltage generator 330 provides the voltage required to perform each operation to the address decoder 320.

In an embodiment, the read/write circuit 340 is connected to the memory cell array 310 through the bit line BL. The read/write circuit 340 sends or receives data DATA1 to or from the page buffer 360. The read/write circuit 340 operates under the control of the control logic 350. The read/write circuit 340 receives the decoded column address DCA from the address decoder 320. The read/write circuit 340 selects the bit line BL using the decoded column address DCA.

For example, in an embodiment, the read/write circuit 340 programs the received data DATA1 to the memory cell array 310. The read/write circuit 340 reads the data from the memory cell array 310 and outputs the read data, for example, to the memory controller 200. In addition, the read/write circuit 340 includes components such as a detection amplifier, a write driver, and a column selection circuit.

In an embodiment, the page buffer 360 sends or receives the data DATA1 to or from the read/write circuit 340, and also sends or receives the data DATA1 to or from the connector CN.

In an embodiment, the control logic 350 is connected to the address decoder 320, the voltage generator 330 and the read/write circuit 340. The control logic 350 controls the operation of the non-volatile memory 300. The control logic

350 operates in response to a control signal CRTL1 and a command CMD1, such as a write command, a read command, etc., received from the connector CN.

Figure 5:
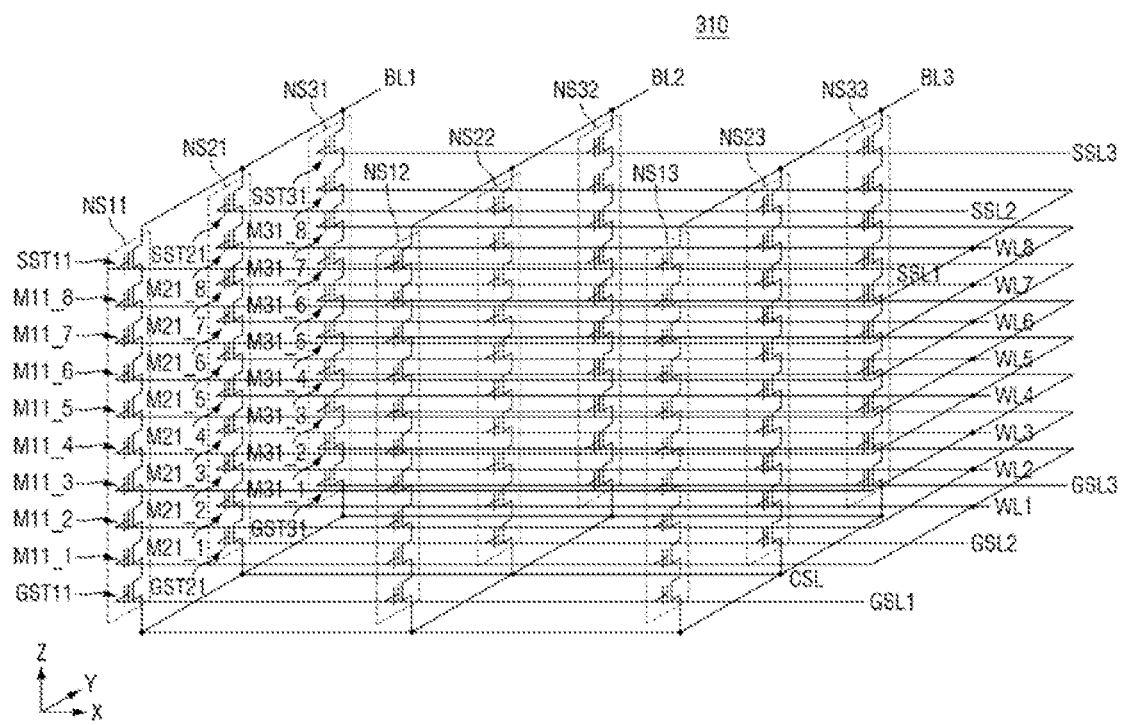
FIG. 5 is a circuit diagram of a memory cell array according to some embodiments.

FIG. 5 is a circuit diagram of a memory cell array according to some embodiments.

Referring to FIG. 5, in an embodiment, a plurality of cell strings NS11, NS21, NS31, NS12, NS22, NS32, NS13, NS23, and NS33 are placed on a substrate in a first direction x and a second direction y. The plurality of cell strings NS11, NS21, NS31, NS12, NS22, NS32, NS13, NS23, and NS33 extend in a third direction z. The plurality of cell strings NS11, NS21, NS31, NS12, NS22, NS32, NS13, NS23, and NS33 are connected in common to a common source line (CSL) formed on or inside the substrate. The common source line CSL is shown as being connected to the lowermost ends in the third direction z of the plurality of cell strings NS11, NS21, NS31, NS12, NS22, NS32, NS13, NS23, and NS33. However, embodiments are not limited to the configuration shown in FIG. 5. In addition, although the plurality of cell strings NS11, NS21, NS31, NS12, NS22, NS32, NS13, NS23, and NS33 are shown in this drawing as being placed in a 3×3 arrangement, embodiments are not limited thereto, and in other embodiments, the arrangement form and number of the plurality of cell strings in the non-volatile memory array 310 can vary.

In an embodiment, cell strings NS11, NS12, and NS13 are connected to a first ground select line GSL1. Cell strings NS21, NS22, and NS23 are connected to a second ground select line GSL2. Cell strings NS31, NS32, and NS33 are connected to a third ground select line GSL3.

In an embodiment, cell strings NS11, NS12, and NS13 are connected to a first string select line SSL1. Cell strings NS21, NS22, and NS23 are connected to a second string select line SSL2. Cell strings NS31, NS32, and NS33 are connected to a third string select line SSL3.

In an embodiment, each of the plurality of cell strings NS11, NS21, NS31, NS12, NS22, NS32, NS13, NS23, and NS33 includes a string select transistor SST11, SST21, SST31 connected to the corresponding string select line. In addition, each of the plurality of cell strings NS11, NS21, NS31, NS12, NS22, NS32, NS13, NS23, and NS33 includes a ground select transistor GST11, GST21, GST31 connected to the corresponding ground select line.

In an embodiment, one end of each ground select transistor GST11, GST21, GST31 of the plurality of cell strings NS11, NS21, NS31, NS12, NS22, NS32, NS13, NS23, and NS33 is connected to the common source line CSL. In addition, each of the plurality of cell strings NS11, NS21, NS31, NS12, NS22, NS32, NS13, NS23, and NS33 includes a plurality of memory cells stacked sequentially in the third direction z between the ground select transistor and the string select transistor. In addition, each of the plurality of cell strings NS11, NS21, NS31, NS12, NS22, NS32, NS13, NS23, and NS33 includes a dummy cell between the ground select transistor and the string select transistor. However, the number of string select transistors included in each string is not limited those shown in this drawing, and the number of string select transistors can vary in other embodiments.

In an embodiment, for example, the cell string NS11 includes a ground select transistor GST11 placed at the lowermost end in the third direction z, a plurality of memory cells M11_1 to M11_8 stacked sequentially in the third direction z on the ground select transistor GST11, and a string select transistor SST11 stacked in the third direction z on the uppermost memory cell M11_8. Further, the cell string NS21 includes a ground select transistor GST21 placed at the lowermost end in the third direction z, a plurality of memory cells M21_1 to M21_8 stacked sequentially in the third direction z on the ground select transistor GST21, and a string select transistor SST21 stacked in the third direction z on the uppermost memory cell M21_8. Further, the cell string NS31 includes a ground select transistor GST31 placed at the lowermost end in the third direction z, a plurality of memory cells M31_1 to M31_8 stacked sequentially in the third direction z on the ground select transistor GST31, and a string select transistor SST31 stacked in the third direction z on the uppermost memory cell M31_8. The configuration of other strings is substantially similar thereto.

In an embodiment, memory cells located at the same height in the third direction z from the substrate or the ground select transistor are electrically connected in common through respective word lines. For example, memory cells at a height of the memory cells M11_1, M21_1, and M31_1 are connected to a first word line WL1. Further, memory cells at a height of the memory cells M11_2, M212, and M31_2 are connected to a second word line WL2. Hereinafter, because the arrangement and structure of the memory cells connected to the third word line WL3 to the eighth word line WL8 are substantially similar thereto, a repeated description thereof will be omitted.

In an embodiment, one end of each of the string select transistors of the plurality of cell strings NS11, NS21, NS31, NS12, NS22, NS32, NS13, NS23, and NS33 is connected to one of the bit lines BL1, BL2, and BL3. For example, the string select transistors ST11, SST21, and SST31 are connected to a bit line BL1 that extends in the second direction y. Because the configuration of the other string select transistors connected to the bit lines BL2 and BL3 is also substantially similar thereto, a repeated description thereof will be omitted.

In an embodiment, memory cells that correspond to one string (or ground) select line and one word line form one page. The write operation and the read operation are performed on a page basis. Each memory cell of each page also stores two or more bits. The bits written on the memory cells of each page form logical pages.

In an embodiment, the memory cell array 310 form a three-dimensional memory array. The 3D memory array is formed monolithically at one or more physical levels of the memory cells and has an active region on a circuit related to the operation of the substrate and the memory cells. The circuit related to the operation of memory cells is placed inside or over the substrate. The monolithic formation means that layers of each level of the 3D array are deposited directly on the layers of a lower level of the 3D array. Alternatively, in an embodiment, the circuit related to the operation of the memory cell is connected to an uppermost contact portion in the third direction z.

Figure 6:
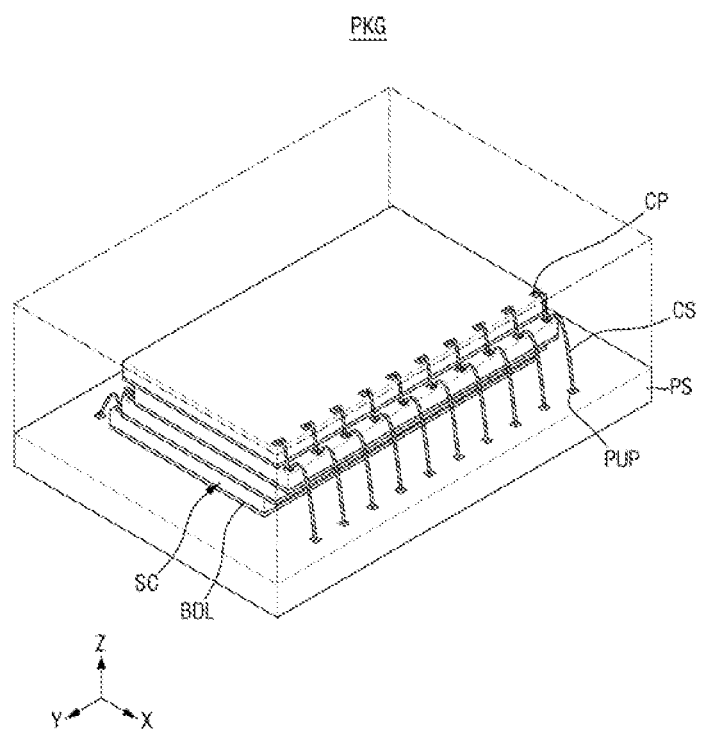
FIG. 6 is a perspective view of a semiconductor package according to some embodiments.

FIG. 6 is a perspective view of a semiconductor package according to some embodiments.

In an embodiment, the semiconductor package PKG includes a package substrate PS, and a semiconductor chip SC disposed on the package substrate PS. In an embodiment, the semiconductor package PKG includes a plurality of semiconductor chips SC. The package substrate PS extends along the first direction X and the second direction Y. The package substrate PS includes a package upper pad PUP. The package upper pad PUP is arranged on the package substrate PS along the second direction Y. The package upper pads PUP are spaced apart from each other.

In an embodiment, the semiconductor chip SC is disposed on the package substrate PS. A bonding layer BDL is interposed between the semiconductor chip SC and the package substrate PS. The semiconductor chip SC and the package substrate PS are bonded by the bonding layer BDL. Further, the plurality of semiconductor chips SC are fixed by a plurality of bonding layers BDL. A plurality of semiconductor chips SC are placed alternately with the bonding layers BDL.

In an embodiment, chip pads CP are disposed on top of each semiconductor chip SC. The chip pads CP are arranged along the second direction Y on a partial region of the semiconductor chip SC. The chip pads CP are spaced apart from each other. A placement of each chip pad CP corresponds to each package upper pad PUP. The chip pads CP are connected to the package upper pad PUP through connection structure CS. Further, the chip pad CP of one semiconductor chip SC is connected to the chip pad CP of another semiconductor chip SC through the connection structure CS. Accordingly, the plurality of semiconductor chips SC can send or receive signals to or from the package substrate PS.

Figure 7:
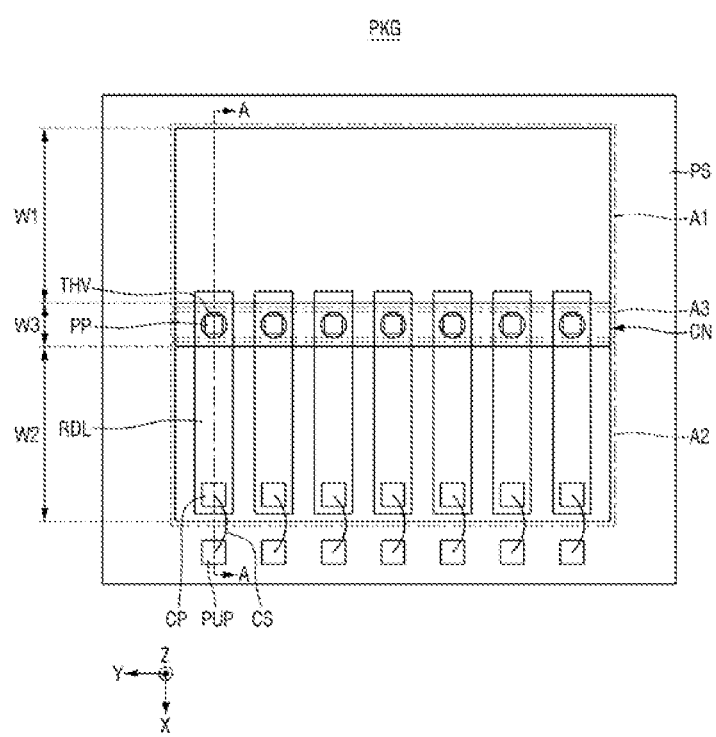
FIG. 7 is a top view of a semiconductor chip of FIG. 6.
Figure 8:
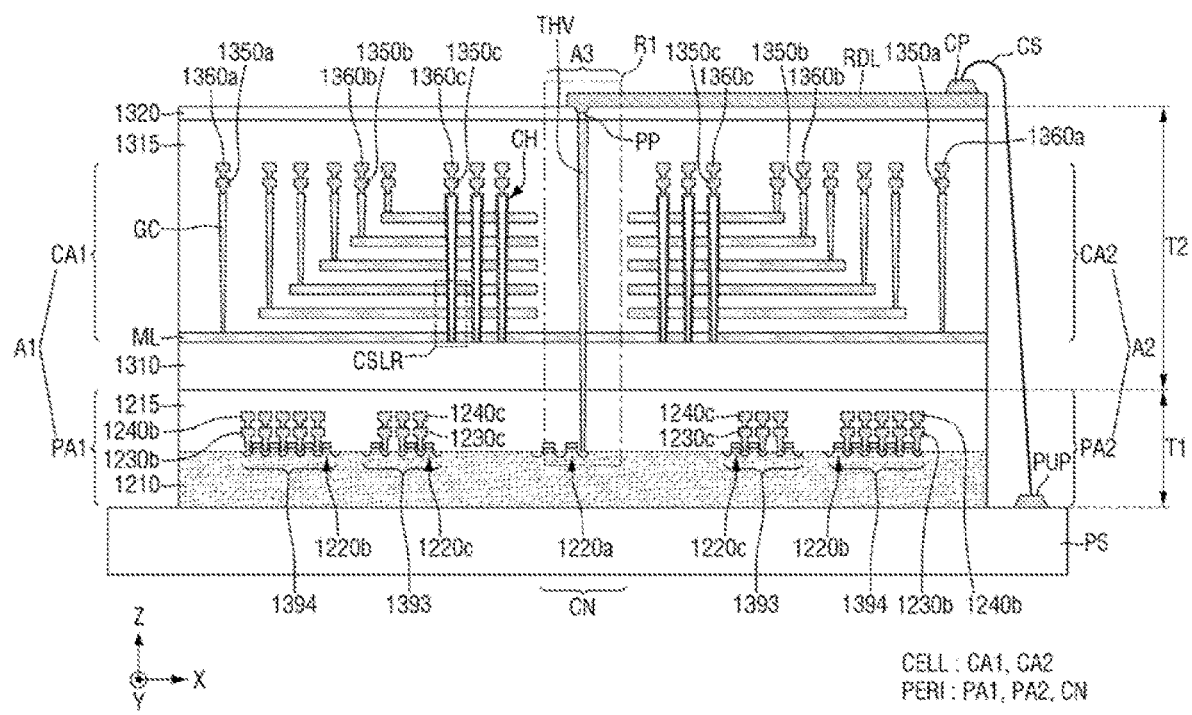
FIG. 8 is a cross-sectional view taken along a line A-A of FIG. 7.
Figure 9:
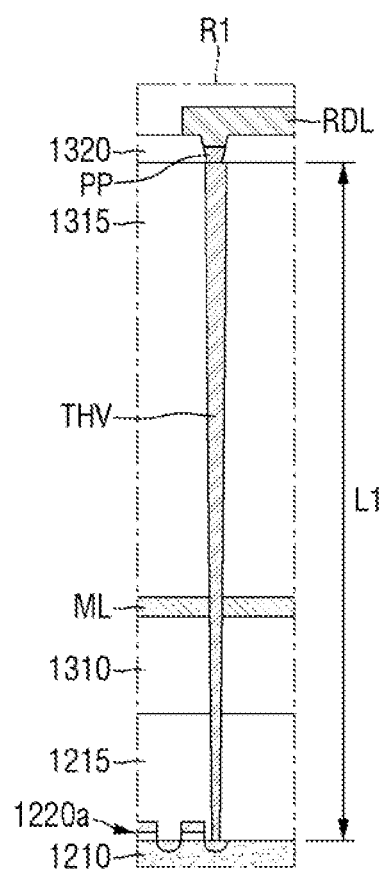
FIGS. 9 and 10 are enlarged views of a region R1 of FIG. 8.
Figure 10:
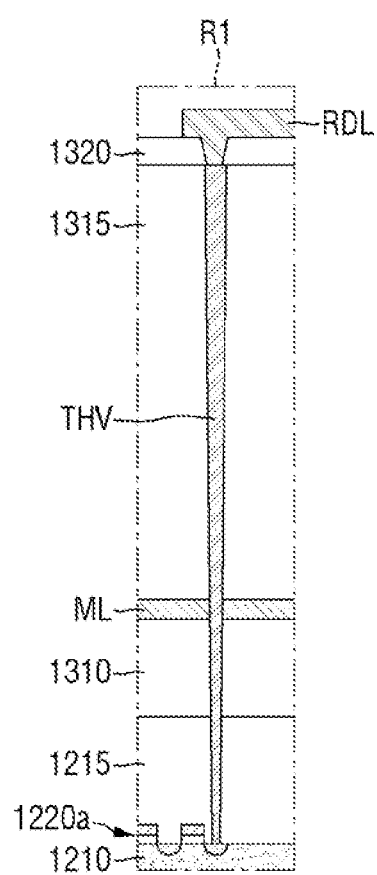
Figure 11:
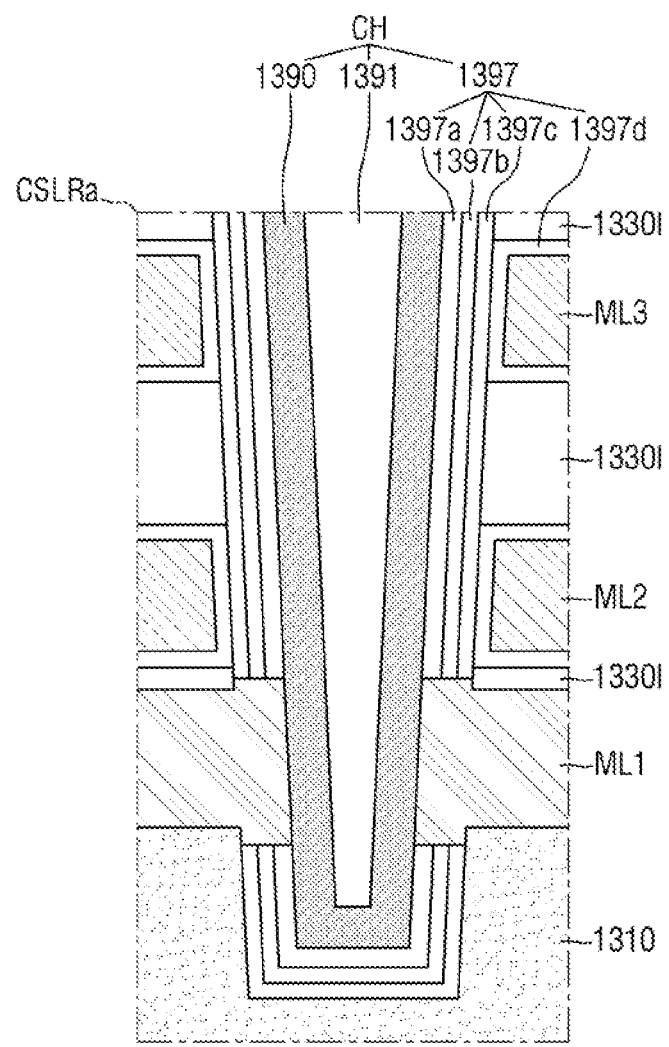
FIGS. 11 and 12 are enlarged views of a region CSLR of FIG. 8.
Figure 12:
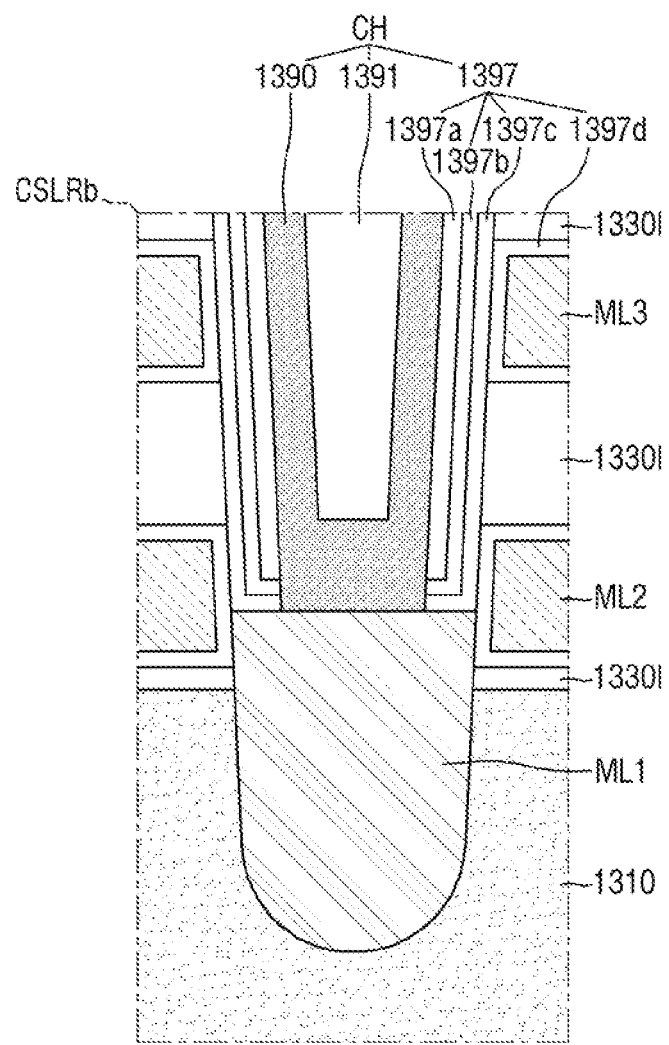

FIG. 7 is a top view of the semiconductor chip of FIG. 6. FIG. 8 is an cross-sectional view taken along a line A-A of FIG. 7. FIGS. 9 and 10 are enlarged views of a region R1 of FIG. 8. FIGS. 11 and 12 are enlarged views of a region CSLR of FIG. 8.

Referring to FIGS. 7 and 8, the semiconductor chip SC of the semiconductor package PKG according to some embodiments has a COP (chip on peri) structure. A COP structure is fabricated by producing an upper chip that includes a cell region CELL and a lower chip that includes a peripheral circuit region PERI, and connecting the upper chip and the lower chip. The cell region includes a first or lower surface and a second or upper surface opposite to the first surface, and the peripheral circuit region is placed on the first surface of the cell region.

In an embodiment, the semiconductor package PKG includes a package substrate PS, a cell region CELL, a peripheral circuit region PERI, a through via THV, a redistribution layer RDL, a chip pad CP, a connection structure CS, etc.

Referring to FIG. 7, in an embodiment, the semiconductor package PKG includes a first region A1, a second region A2, and a third region A3. When viewed from above, the third region A3 extends along the second direction Y between the first region A1 and the second region A2. The first region A1 extends in the first direction X from the third region A3, and the second region A2 extends in the opposite first direction from the third region A3. That is, the third region A3 is interposed between the first region A1 and the second region A2. Further, although the third region A3 separates the semiconductor package PKG into the first region A1 and the second region A2, embodiments according to the technical idea of the present disclosure are not limited thereto.

In some embodiments, a width of the first region A1 of the semiconductor chip SC in the first direction X is a first width W1, a width of the second region A2 of the semiconductor chip SC in the first direction X is a second width W2, and a width of the third region A3 of the semiconductor chip SC in the first direction X is a third width W3. Here, the third width W3 is smaller than the first width W1 and the second width W2. In addition, the first width W1 and the second width W2 are substantially the same. However, embodiments according to the technical idea of the present disclosure are not limited thereto.

Referring to FIGS. 7 and 8, in some embodiments, the peripheral circuit region PERI include a first peripheral circuit region PA1, a second peripheral circuit region PA2, a connector CN, etc. The first peripheral circuit region PA1 is located in the first region A1. Further, the second peripheral circuit region PA2 is located in the second region A2, and the connector CN is located in the third region A3. That is, the connector CN is located in the third region A3 and extends along the second direction Y.

In some embodiments, the peripheral circuit region PERI includes a first substrate 1210, an interlayer insulating layer 1215, a plurality of circuit elements 1220b and 1220c formed on the first substrate 1210, first metal layers 1230b and 1230c connected to the plurality of circuit elements 1220b and 1220c, and second metal layers 1240b and 1240c formed on the first metal layer 1230b and 1230c. In some embodiments, the first metal layers 1230b and 1230c are made of tungsten, which has a relatively high resistance, and the second metal layers 1240b and 1240c are formed of copper, which has a relatively low resistance.

In an embodiment, although only the first metal layers 1230b and 1230c and the second metal layers 1240b and 1240c are shown and described, embodiments of the present disclosure are not limited thereto, and in other embodiments, one or more metal layers may also be further formed on the second metal layers 1240b and 1240c. At least a part of the one or more metal layers formed on the upper part of the second metal layers 1240b and 1240c is formed of aluminum, which has a lower resistance than the copper used to form the second metal layers 1240b and 1240c.

In some embodiments, the interlayer insulating layer 1215 covers the plurality of circuit elements 1220b and 1220c, the first metal layers 1230b and 1230c, and the second metal layers 1240b and 1240c. The interlayer insulating layer 1215 includes an insulating material such as silicon oxide or silicon nitride.

In some embodiments, the first peripheral circuit region PA1 include the plurality of circuit elements 1220b and 1220c, the first metal layers 1230b and 1230c, and the second metal layers 1240b and 1240c. In addition, the second peripheral circuit region PA2 includes a plurality of circuit elements 1220b and 1220c, first metal layers 1230b and 1230c, and second metal layers 1240b and 1240c that differ from those of the first peripheral circuit region PA1. The elements of the first peripheral circuit region PA1 and the elements of the second peripheral circuit region PA2 are placed symmetrically. However, embodiments according to the technical idea of the present disclosure are not limited thereto.

In some embodiments, the circuit element 1220b operates as a row decoder 1394, and the circuit element 1220c operates as a page buffer 1393. For example, the circuit element 1220b is the address decoder 320 of FIG. 4, and the circuit element 1220c is the page buffer 360 of FIG. 4.

In some embodiments, the peripheral circuit region PERI includes a plurality of circuit elements 1220a formed on the first substrate 1210. The circuit elements 1220a are formed in the third region A3. Further, the connector CN includes a circuit element 1220a. The circuit element 1220a is connected to the row decoder 1394, the page buffer 1393, etc., of the first peripheral circuit region PA1 and the second peripheral circuit region PA2 to transmit and receive signals. That is, the circuit element 1220a transmits or receives signals to or from the circuit elements 1220b and 1220c of the first region A1 and the second region A2. The circuit element 1220a is placed between a plurality of circuit elements 1220b and 1220c.

In some embodiments, the cell region CELL includes a first cell region CA1 and a second cell region CA2. The first cell region CA1 is located in the first region A1, and the second cell region CA2 is located in the second region A2.

The cell region CELL is located above the peripheral circuit region PERT. That is, the first cell region CA1 is located on the first peripheral circuit region PA1, and the second cell region CA2 is located on the second peripheral circuit region PA2.

In some embodiments, the cell region CELL includes a second substrate 1310, and a plurality of metal layers ML stacked on the second substrate 1310 in the third direction Z. Of the plurality of metal layers ML, the metal layer ML placed on an upper surface of the second substrate 1310 is a common source line, and the other stacked metal layers ML are word lines. A string select line and a ground select line are placed above and below the word lines.

The second substrate 1310 may include a semiconductor substrate, such as a silicon substrate, a germanium substrate, or a silicon-germanium substrate, for example. Alternatively, the second substrate 1310 may include a silicon-on-insulator (SOI) substrate, a germanium-on-insulator (GOI) substrate, or the like.

In some embodiments, cell region CELL includes a channel structure CH that extends in a direction perpendicular to the upper surface of the second substrate 1310. The channel structure CH extends in the third direction Z and penetrates the plurality of metal layers ML.

Referring to FIGS. 11 and 12, in some embodiments, the channel structure CH extends in the vertical direction Z. The channel structure CH includes a data storage layer 1397, a channel layer 1390, a buried insulating layer 1391, etc., and the channel layer 1390 is electrically connected to a first metal layer 1350c and a second metal layer 1360c. For example, the first metal layer 1350c is a bit line contact, and the second metal layer 1360c is a bit line. In some embodiments, the bit line 1360c extends along a second direction Y parallel to the upper surface of the second substrate 1310.

The second substrate 1310, the metal layer ML and the channel structures CH of the non-volatile memory device 1 according to some embodiments may have various forms. Various structures of the second substrate 1310, the metal layer ML, and the channel structure CH of the non-volatile memory device 1 according to some embodiments will be described below by expanding the region CSLR.

Referring to FIGS. 8, 11 and 12, in some embodiments, insulating layers 1330I are interposed between the respective word lines ML2 and ML3 and the common source line ML1. The word lines ML2 and ML3 and the common source line ML1 are insulated by the insulating layer 1330I.

In some embodiments, the channel layer 1390 extends in the third direction Z. Although the channel layer 1390 is shown as having a stacked cup shape, embodiments are not limited thereto, and in other embodiments, the channel layer 1390 has various other shapes, such as a cylindrical shape, a square tubular shape, a solid filler shape, or a single cup shape. The channel layer 1390 includes, but is not limited to, semiconductor materials such as, for example, single crystal silicon, polycrystalline silicon, an organic semiconductor material or a carbon nanostructure.

In some embodiments, a data storage layer 1397 is interposed between the channel layer 1390 and the word lines ML1 and ML2. For example, the data storage layer 1397 extends along the sides of the channel layer 1390.

In some embodiments, the data storage layer 1397 is formed of multiple films. For example, the data storage layer 1397 includes a tunnel insulating film 1397a, a charge storage film 1397b, and a blocking insulating film 1397c, which are sequentially stacked on the channel layer 1390. The tunnel insulating film 1397a includes, for example, a silicon oxide or a high dielectric constant material that has a higher dielectric constant than silicon oxide, such as aluminum oxide ($Al_2O_3$) or hafnium oxide ($HfO_2$). The charge storage film 1397b includes, for example, silicon nitride. The blocking insulating film 1397c includes, for example, a silicon oxide or a high dielectric constant material that has a higher dielectric constant than silicon oxide. In some embodiments, the data storage layer 1397 further includes a gate insulating film 1397d that extends along the surfaces of each of the word lines ML2 and ML3.

In some embodiments, the channel structure CH further includes a buried insulating layer 1391. The buried insulating layer 1391 fills the inside of the cup-shaped semiconductor pattern 1390. The buried insulating layer 1391 includes, but is not limited to, insulating materials, such as silicon oxide.

In some embodiments, the common source line ML1 is connected to the channel layer 1390 of the channel structure CH.

As shown in FIG. 11, in some embodiments, the channel structure CH penetrates the common source line ML1 and is buried inside the second substrate 1310. The common source line ML1 penetrates a part of the data storage layer 1397 and is connected to the sides of the channel layer 1390.

As shown in FIG. 12, in some embodiments, at least a part of the common source line ML1 is buried inside the second substrate 1310. The common source line ML1 is formed, for example, from the second substrate 1310 by a selective epitaxial growth (SEG) process. The channel structure CH penetrates a part of the data storage layer 1397 and is connected to the upper surface of the common source line ML1.

Referring to FIG. 8 again, in some embodiments, the first metal layer 1350c and the second metal layer 1360c are electrically connected to the circuit element 1220c that provides a page buffer 1393 in the peripheral circuit region PERI.

In some embodiments, the metal layers ML extend along the first direction X parallel to the upper surface of the second substrate 1310. The metal layers ML are connected to a plurality of contact plugs GC. A first metal layer 1350b and a second metal layer 1360b are placed on the plurality of contact plugs GC. The contact plugs GC are electrically connected to the circuit element 1220b that provides a row decoder 1394 in the peripheral circuit region PERI. In some embodiments, the operating voltage of the circuit elements 1220b that provide the row decoder 1394 differs from the operating voltage of the circuit elements 1220c that provide the page buffer 1393. For example, the operating voltage of the circuit elements 1220c of the page buffer 1393 is higher than the operating voltage of the circuit elements 1220b of the row decoder 1394.

In some embodiments, the lower metal layer ML, which is a common source line, is connected to a first metal layer 1350a and a second metal layer 1360a through the contact plug GC. An interlayer insulating layer 1315 covers the first cell region CA1 and the second cell region CA2. For example, each metal layer ML is electrically insulated by the interlayer insulating layer 1315.

In some embodiments, the first cell region CA1 includes the plurality of metal layers ML, the channel structures CH, the contact plugs GC, the first metal layers 1350a, 1350b, and 1350c, and the second metal layers 1360a, 1360b, and 1360c. Further, the second cell region CA2 includes the plurality of metal layers ML, the channel structures CH, the contact plugs GC, the first metal layers 1350a, 1350b, and 1350c, and second metal layers 1360a, 1360b, and 1360c that differ from the configuration of the first cell region CA1.

For example, FIG. 8 shows that the configuration of the second cell region CA2 is symmetric to the configuration of the first cell region CA with respect to the through via THV. For example, the metal layers ML of the of the second cell region CA2 have a stair structure that is symmetric to the stair structure of the metal layers ML of the first cell region CA1. However, although the configuration of the first cell region CA1 and the configuration of the second cell region CA2 are symmetrical, embodiments according to the technical idea of the present disclosure are not limited thereto.

For example, in some embodiments, the stacked metal layers ML of the first cell region CA1 have a stair structure. As shown in FIG. 8, a length of the lower metal layer ML in the first direction X is greater than a length of the upper metal layer ML in the first direction X. Here, the structure of the plurality of metal layers ML in a direction opposite to the first direction X has a stair structure, but embodiments are not limited thereto, and the structure of the plurality of metal layers ML in the first direction X need not have a stair structure. The stacked metal layers ML of the second cell region CA2 also have a stair structure, like the stacked metal layers ML of the first cell region CA1. That is to say, the first cell region CA1 and the second cell region CA2 each generally have a stair structure.

In some embodiments, the semiconductor chip SC includes a through via THV. The through via THV extends from the upper surface of the cell region CELL to the circuit element 1220a of the peripheral circuit region PERI. That is, the through via THV extends from the upper surface of the interlayer insulating layer 1315. The through via THV extends along the third direction Z. The through via THV includes conductive materials such as a metal, a metal compound or polysilicon.

In some embodiments, the through via THV is formed inside the third region A3. That is, the through via THV is located in the region between the first region A1 and the second region A2. The through via THV penetrates the cell region CELL. The through via THV is electrically connected to the circuit element 1220a.

In some embodiments, the peripheral circuit region PERI has a first thickness T1 and the cell region CELL has a second thickness T2. In addition, referring to FIG. 9, the through via THV has a first length L1. The first length L1 is greater than the first thickness T1. In addition, the first length L1 is greater than the second thickness T2. The first length L1 is less than the sum of the first thickness T1 and the second thickness T2. However, embodiments according to the technical idea of the present disclosure are not limited thereto.

Referring to FIGS. 7 and 8 again, in some embodiments, a plurality of the through via THV are arranged along the second direction Y. That is, the respective through vias THV spaced apart from each other along the second direction Y. The through vias THV are placed in the third region A3.

In some embodiments, an insulating layer 1320 is formed on the upper surface of the cell region CELL. In addition, a pre pad PP is formed on the exposed upper surface of the through via THV. The pre pad PP is formed by filling holes formed in the insulating layer 1320. In this case, the pre pad PP is in contact with the through via THV and is electrically connected thereto. Further, the pre pad PP is surrounded by the insulating layer 1320.

In some embodiments, the redistribution layer RDL is formed on the insulating layer 1320 on the upper surface of the cell region. The redistribution layer RDL fills a trench in the insulating layer 1320 on the pre pad PP. In addition, the redistribution layer RDL extends in the first direction X on the upper surface. Referring to FIG. 7, the redistribution layer RDL overlaps the second region A2 and the third region A3, but the redistribution layer RDL does not overlap the first region A1. For example, the redistribution layer RDL covers the second cell region CA2 and the second peripheral circuit region PA2 of the second region A2. In addition, one end of the redistribution layer RDL covers the through via THV of the third region A3. However, the redistribution layer RDL does not cover the first cell region CA1 and the first peripheral circuit region PA1 of the first region A1. However, embodiments according to the technical idea of the present disclosure are not limited thereto.

In some embodiments, the redistribution layer RDL includes, for example, a metallic material, and is electrically connected to the through via THV and the pre pad PP. The plurality of redistribution layers RDL are spaced apart from each other. In addition, each redistribution layer RDL corresponds to each through via THV.

In some embodiments, the chip pad CP is placed on the redistribution layer RDL. The chip pad CP is placed in the first region A1, but is not placed in the second region A2 and third region A3. For example, the chip pad CP is placed at the distal end in the first direction X of the redistribution layer RDL opposite from the pre pad PP, which is placed at the proximal end of the redistribution layer RDL. The chip pad CP may be electrically connected to the redistribution layer RDL.

In some embodiments, the chip pad CP does not overlap the through via THV. For example, when viewed from above, the chip pad CP is placed in the second region A2 and the through via THV is placed in the third region A3. That is, the chip pad CP and the through via THV are placed in different regions and are redistributed by the redistribution layer RDL.

In some embodiments, the semiconductor chip SC is mounted and bonded on the package substrate PS. The package upper pad PUP of the package substrate PS is connected to the chip pad CP through the connection structure CS. That is, the semiconductor chip SC and the package substrate PS are electrically connected through the chip pad CP, the connection structure CS, and the package upper pad PUP, and transmit or receive signals. That is, the circuit elements 1220a, 1220b, and 1220c of the peripheral circuit region PERI are electrically connected to the package substrate PS through the through via THV, the pre pad PP, the redistribution layer RDL, the chip pad CP, the connection structure CS, and the package upper pad PUP. Here, the connection structure CS includes metal wires.

In some embodiments, by transmitting or receiving signals through the through via THV in the third region A3, power consumed while transmitting signals from the circuit elements 1220b and 1220c in the first region A1, and power consumed while transmitting signals from the circuit elements 1220b and 1220c in the second region A2 can be reduced. That is, when the through via THV is located in the outer region, power consumed while transmitting signals from the circuit elements 1220b and 1220c increases, as the distance from the through via THV to the circuit elements 1220b and 1220c increases. However, in an embodiment, the through via THV is placed in the third region A3, and the power consumed during signal transmission decreases.

In addition, in some embodiments, since the chip pad CP is located on the cell region CELL and the peripheral circuit region PERI, the size of the semiconductor chip SC decreases by a size occupied by the through via THV and the chip pad CP.

Referring to FIG. 10, in some embodiments, the pre pad PP is not placed inside the semiconductor chip SC. As a result, the through via THV and the redistribution layer RDL are in direct contact with each other, and are electrically connected. That is, there is no connection pad that overlaps the through via THV.

FIGS. 13 to 16 illustrate a method for fabricating a semiconductor package according to some embodiments.

Figure 13:
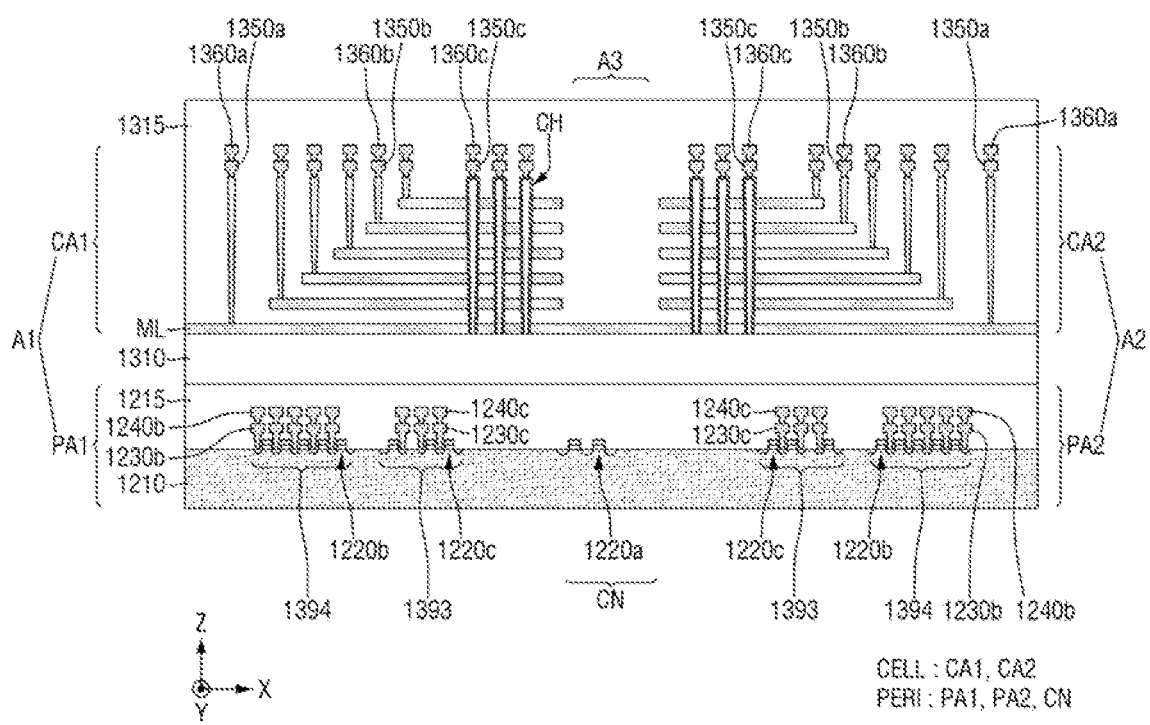
FIGS. 13 to 16 illustrate a method for fabricating a semiconductor package according to some embodiments.

Referring to FIG. 13, in some embodiments, a semiconductor chip SC is formed that has the cell region CELL and the peripheral circuit region PERI. That is, a semiconductor chip SC that includes the first peripheral circuit region PA1 and the first cell region CA1 in the first region A1, includes the second peripheral circuit region PA2 and the second cell region CA2 in the second region A2, and includes the connector CN in the third region A3 is formed. In addition, the cell region CELL and the peripheral circuit region PERI are bonded to each other.

Figure 14:
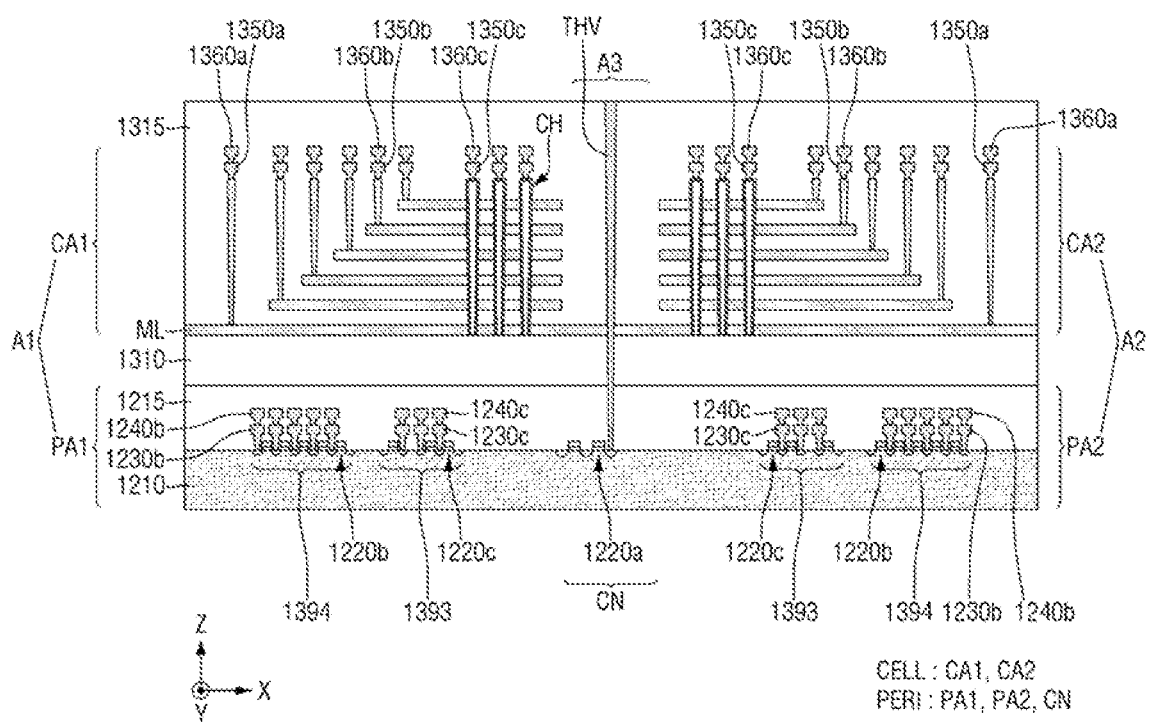

Referring to FIG. 14, in some embodiments, a through via THV is formed that penetrates the interlayer insulating layer 1215, the second substrate 1310 and the interlayer insulating layer 1315. The through via THV extends from the upper surface of the interlayer insulating layer 1315 to the circuit element 1220a. The through via THV is formed in a hole that penetrates the interlayer insulating layer 1215, the second substrate 1310 and the interlayer insulating layer 1315. The through via THV is formed in the third region A3, and is spaced apart in the first direction x from the first cell region CA1 and the second cell region CA2. For example, the through via THV is spaced apart in the first direction x from the plurality of metal layers ML.

Figure 15:
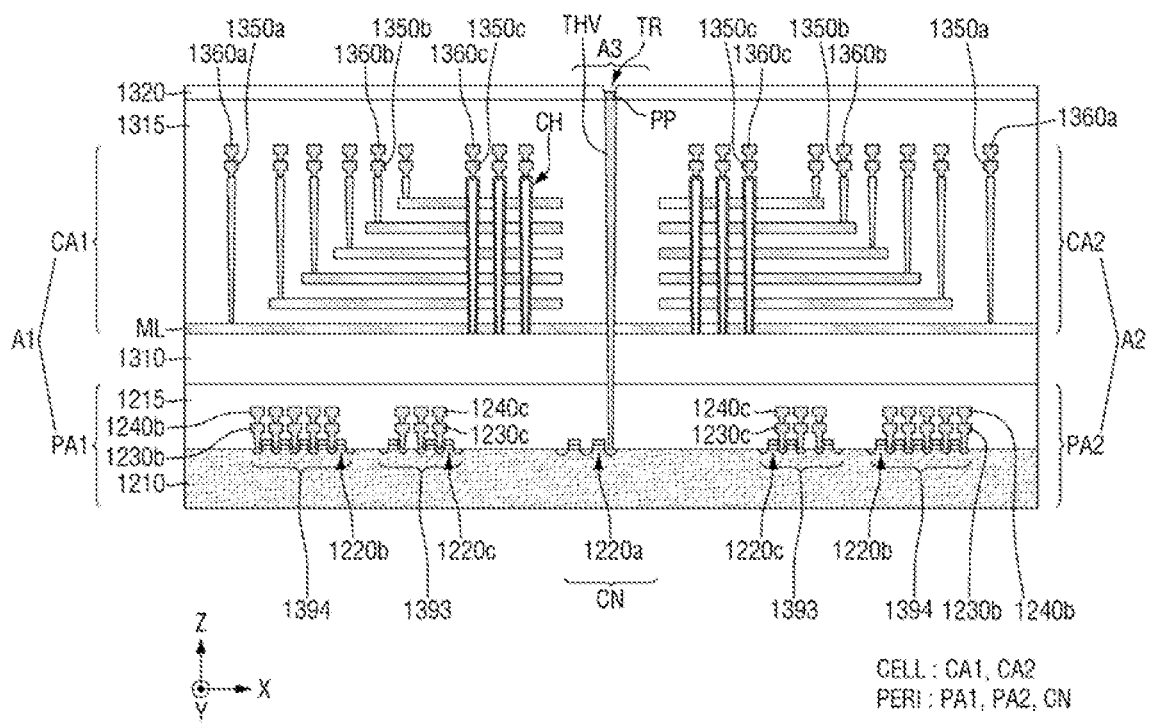

Referring to FIG. 15, in some embodiments, the insulating layer 1320 is formed on the interlayer insulating layer 1315. Further, a trench tr is formed in the insulating layer 1320. A pre pad PP is formed in the formed trench tr. As a result, the pre pad PP is connected to the through via THV. However, embodiments according to the technical idea of the present disclosure are not limited thereto, and the pre pad PP may be omitted in other embodiments.

Figure 16:
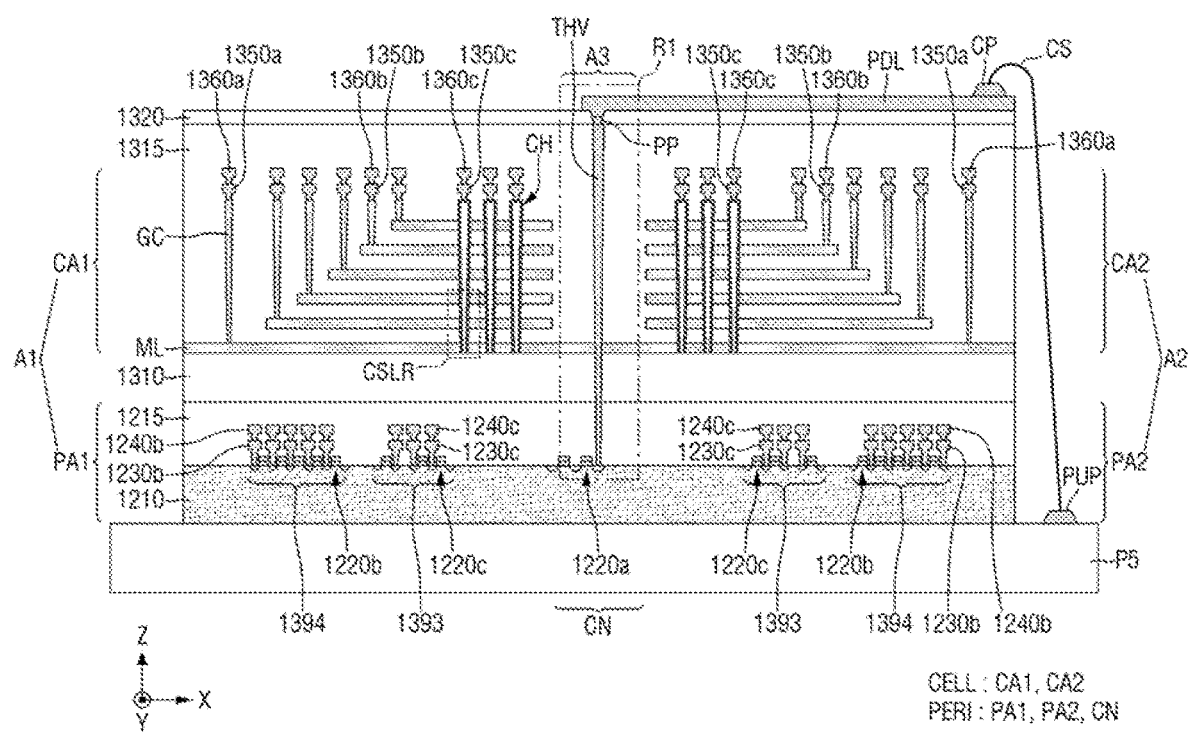

Referring to FIG. 16, in some embodiments, the redistribution layer RDL is formed on the insulating layer 1320. The redistribution layer RDL fills the trench tr and extends along the first direction X. Although the redistribution layer RDL extends to the distal end of the insulating layer 1320 in the first direction X, embodiments according to the technical idea of the present disclosure are not limited thereto. The chip pad CP is formed on the redistribution layer RDL corresponding to the distal end of the insulating layer 1320. The chip pad CP does not overlap the through via THV.

In some embodiments, the semiconductor chip SC is mounted on the package substrate PS. For example, the semiconductor chip SC is bonded to the package substrate PS. That is, the first substrate 1210 is in contact with the package substrate PS. The chip pad CP of the semiconductor chip SC and the package upper pad PUP of the package substrate PS are connected through the connection structure CS.

Hereinafter, a semiconductor package PKG according to another embodiment will be described with reference to FIGS. 17 and 18.

Figure 17:
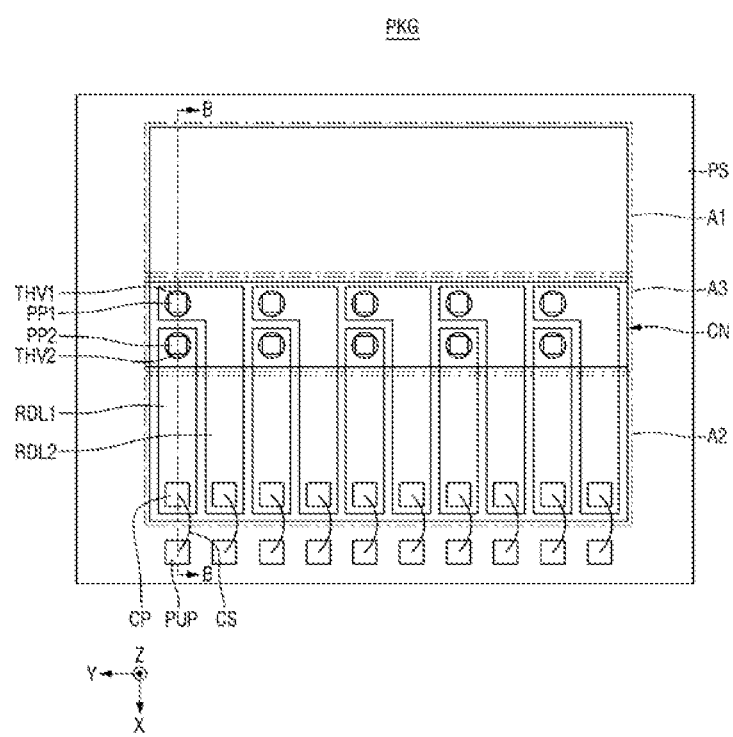
FIG. 17 is a top view of a semiconductor package according to some embodiments.

FIG. 17 is a top view of a semiconductor package according to some embodiments. FIG. 18 is a cross-sectional view taken along a line B-B of FIG. 17. For convenience of explanation, components that are the same as those described with reference to FIGS. 1 to 16 will be briefly described or their descriptions will be omitted.

Figure 18:
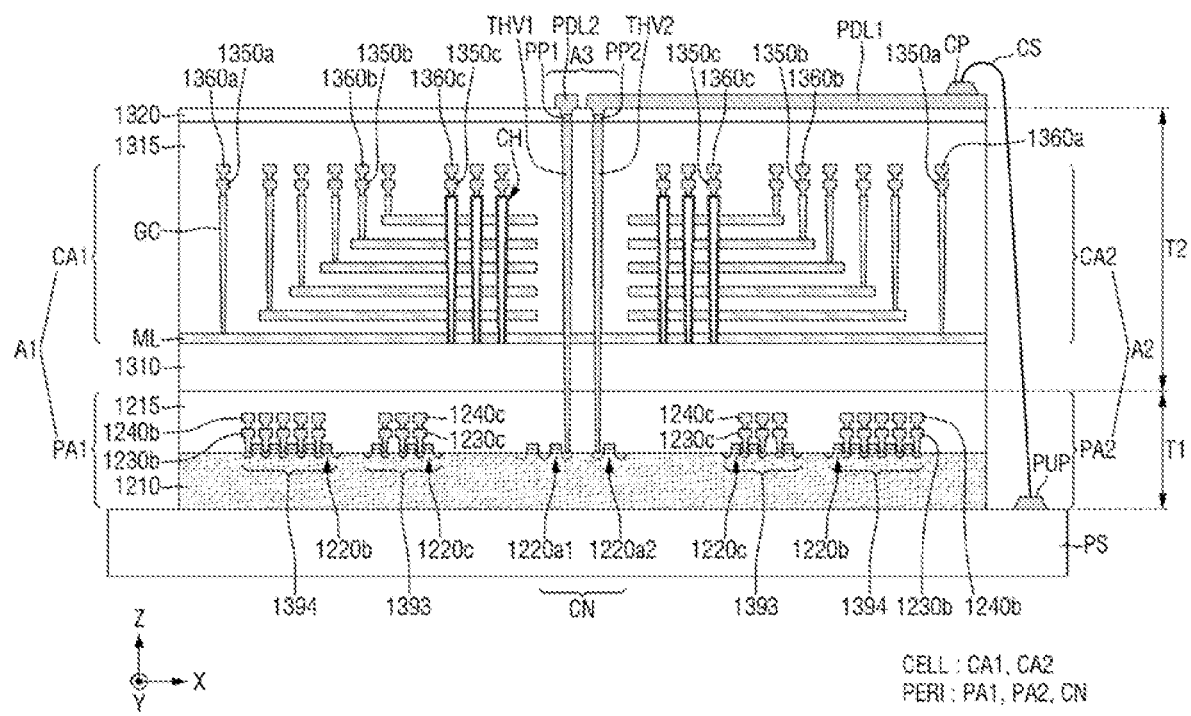
FIG. 18 is a cross-sectional view taken along a line B-B of FIG. 17.

Referring to FIGS. 17 and 18, in some embodiments, the semiconductor chip SC of the package PKG includes a first through via THV1, a second through via THV2, a first pre pad PP1, a second pre pad PP2, a first redistribution layer RDL1, and a second redistribution layer RDL2.

In some embodiments, the first through via THV1 extends from the upper surface of the interlayer insulating layer 1315 to a circuit element 1220a1. The first pre pad PP1 is formed on the first through via THV1 and is connected to the first through via THV1, and the first pre pad PP1 is connected to the second redistribution layer RDL2. The second redistribution layer RDL2 is spaced apart from the first redistribution layer RDL1 by a constant interval, and extends in the first direction X. Specifically, in an embodiment, each second redistribution layer RDL2 has an L shape that extends in the second direction y to bypass the first redistribution layer RDL1, and then extends in the first direction x parallel to the first redistribution layer RDL1.

In some embodiments, the second through via THV2 extends from the upper surface of the interlayer insulating layer 1315 to a circuit element 1220a2. The second pre pad PP2 is formed on the second through via THV2 and is connected to the second through via THV2, and the second pre pad PP2 is connected to the first redistribution layer RDL1. The first redistribution layer RDL1 is spaced apart from the second redistribution layer RDL2 at a constant interval, and extends in the first direction X.

In an embodiment, the first redistribution layer RDL1 and the second redistribution layer RDL2 are redistributed and connected to the chip pad CP. As a result, by placing more redistribution layers RDL1 and RDL2 in a certain area of the semiconductor chip SC, more chip pads CP can be placed on the semiconductor chip SC.

Hereinafter, a semiconductor package PKG according to another embodiment will be described referring to FIGS. 19 and 20.

Figure 19:
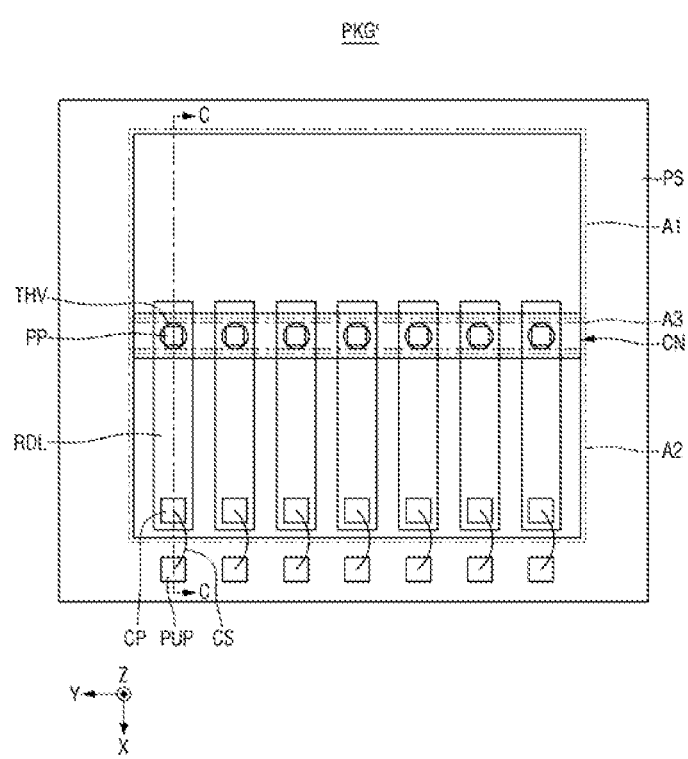
FIG. 19 is a top view of a semiconductor package according to some embodiments.

FIG. 19 is a top view of a semiconductor package according to some embodiments. FIG. 20 is a cross-sectional view taken along a line C-C of FIG. 19. For convenience of explanation, components that are the same as those described with reference to FIGS. 1 to 16 will be briefly described or their descriptions will be omitted.

Figure 20:
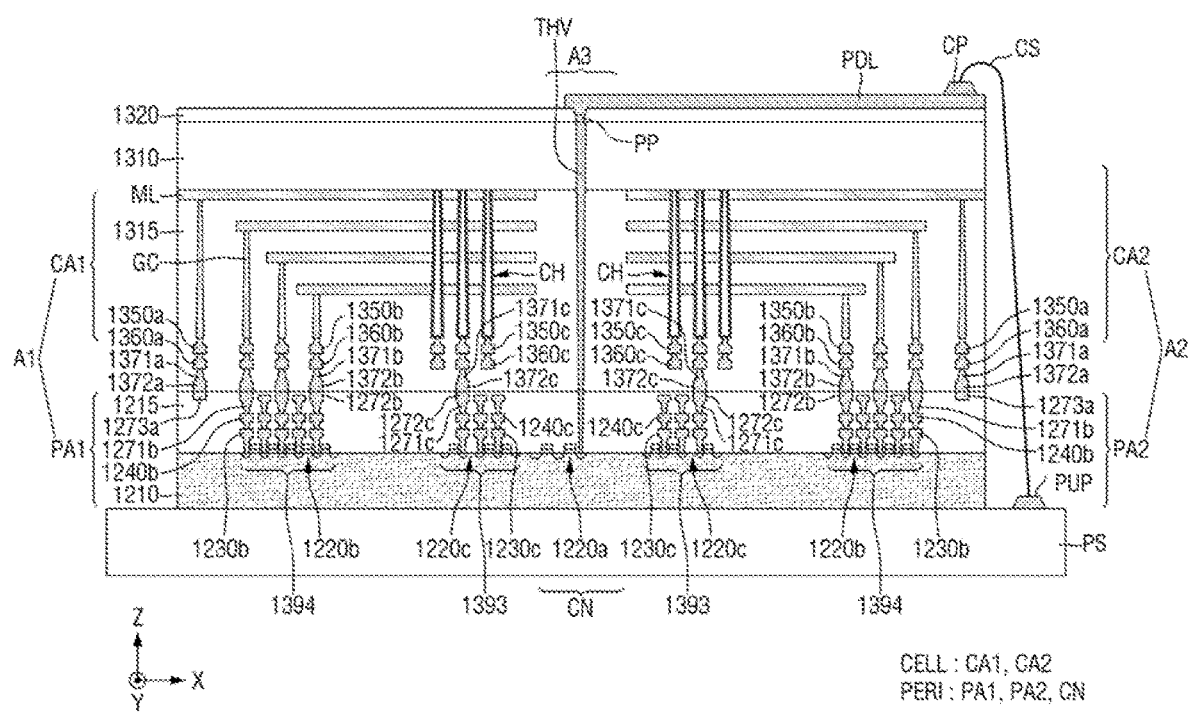
FIG. 20 is a cross-sectional view taken along a line C-C of FIG. 19.

Referring to FIGS. 19 and 20, in an embodiment, a semiconductor chip SC of the semiconductor package PKG' has a C2C (chip to chip) structure. A C2C structure has an upper chip that includes the cell region CELL manufactured on a first wafer, a lower chip that includes the peripheral circuit region PERI manufactured on a second wafer that differs from the first wafer, where the upper chip and the lower chip are bonded to each other. For example, bonding metal formed on the lowermost metal layer of the upper chip is electrically connected to a bonding metal formed on the uppermost metal layer of the lower chip. For example, when the bonding metal is formed of copper (Cu), the bonding is a Cu—Cu bonding. The bonding metal may also be formed of aluminum or tungsten.

In an embodiment, the peripheral circuit region PERI includes a first substrate 1210, an interlayer insulating layer 1215, a plurality of circuit elements 1220a, 1220b, and 1220c formed on the first substrate 1210, first metal layers 1230b and 1230c connected to each of the plurality of circuit elements 1220a, 1220b, and 1220c, and second metal layers 1240b and 1240c formed on the first metal layers 1230b and 1230c.

In an embodiment, the interlayer insulating layer 1215 is disposed on the first substrate 1210 and covers the plurality of circuit elements 1220a, 1220b, and 1220c, the first metal layers 1230*b* and 1230*c*, and the second metal layers 1240*b* and 1240*c*. The interlayer insulating layer 1215 includes an insulating material such as silicon oxide and silicon nitride.

In an embodiment, lower bonding metals 1271*b* and 1272*b* are formed on the second metal layer 1240*b*. The lower bonding metals 1271*b* and 1272*b* of the peripheral circuit region PERI are electrically connected to upper bonding metals 1371*b* and 1372*b* of the cell region CELL by bonding. The lower bonding metals 1271*b* and 1272*b* and the upper bonding metals 1371*b* and 1372*b* are formed of aluminum, copper, or tungsten, etc.

In an embodiment, the cell region CELL provides at least one memory block. The cell region CELL includes a second substrate 1310 and a metal layer ML. A plurality of metal layers ML are stacked on the second substrate 1310 along the third direction Z perpendicular to the upper surface of the second substrate 1310. A string select line and a ground select line are placed above and below the metal layer ML, respectively, and the plurality of metal layers ML are placed between the string select lines and the ground select line.

In an embodiment, a channel structure CH extends in the third direction Z perpendicular to the upper surface of the second substrate 1310 and penetrates the metal layer ML, the string select lines, and the ground select line.

In an embodiment, a first metal layer 1350*c* and a second metal layer 1360*c* are formed on the channel structure CH. The metal layers ML are connected to the first metal layer 1350*b* and the second metal layer 1360*b* through a contact plug GC. Further, the metal layer ML that is a common source line is connected to the first metal layer 1350*a* and the second metal layer 1360*a* through the contact plug GC.

In an embodiment, the second metal layer 1360*c* is electrically connected to circuit elements 1220*c* that provide a page buffer 1393 in the peripheral circuit region PERI. For example, the second metal layer 1360*c* is connected to the upper bonding metals 1371*c* and 1372*c* in the peripheral circuit region PERI, and the upper bonding metals 1371*c* and 1372*c* are connected to the lower bonding metals 1271*c* and 1272*c* connected to the circuit elements 1220*c* of the page buffer 1393.

In an embodiment, the contact plug GC is connected to the peripheral circuit region PERI through the upper bonding metals 1371*b* and 1372*b* of the cell region CELL and the lower bonding metals 1271*b* and 1272*b* of the peripheral circuit region PERI.

In an embodiment, the contact plug GC is electrically connected to circuit elements 1220*b* that provide a row decoder 1394 in the peripheral circuit region PERI. In some embodiments, the operating voltage of the circuit elements 1220*b* that provide the row decoder 1394 differs from the operating voltage of the circuit elements 1220*c* that provide the page buffer 1393. For example, the operating voltage of the circuit elements 1220*c* of the page buffer 1393 is higher than the operating voltage of the circuit elements 1220*b* of the row decoder 1394.

In an embodiment, a first metal layer 1350*a* and a second metal layer 1360*a* are sequentially stacked on the contact plug GC. Upper bonding metals 1371*a* and 1372*a* are formed on the second metal layer 1360*a*. The upper bonding metals 1371*a* and 1372*a* are connected to a lower metal pattern 1273*a* of the peripheral circuit region PERI.

In an embodiment, a through via THV extends from the upper surface of the second substrate 1310 to the circuit element 1220*a*. For example, the through via THV penetrates the second substrate 1310, the interlayer insulating layer 1315, and the interlayer insulating layer 1215. In addition, the through via THV is electrically connected to the package substrate PS through the redistribution layer RDL. As a result, power consumption of the semiconductor package PKG' can be reduced, and the size of the semiconductor chip SC can be further reduced.

In an embodiment, the stacked metal layers ML of the first cell region CA1 have a stair structure. As shown in FIG. 20, a length of a lower metal layer ML in the first direction X is less than a length of an upper metal layer ML in the first direction X. The stacked metal layers ML of the second cell region CA2 also have a stair structure, like the stacked metal layers ML of the first cell region CA1. The stair structure of the first cell region CA1 and the stair structure of the second cell region CA2 are symmetric to each other with respect to the through via THV.

Hereinafter, an electronic system 2000 according to another embodiment will be described referring to FIGS. 21 to 25.

Figure 21:
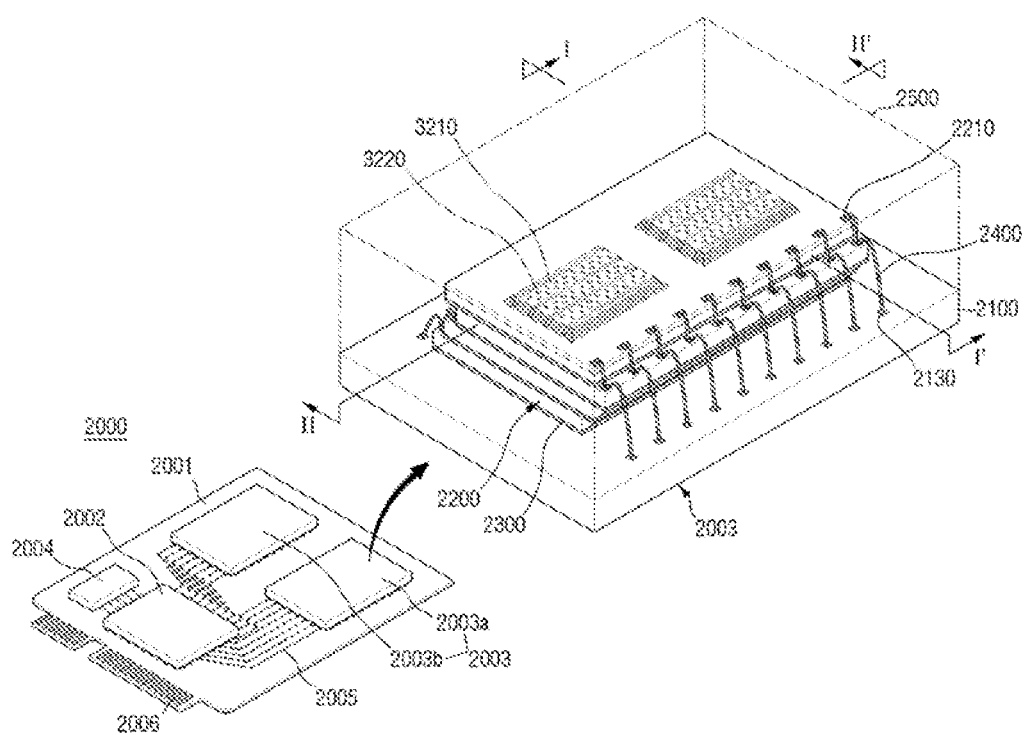
FIG. 21 is a perspective view of a non-volatile memory system according to some embodiments.

FIG. 21 is an exemplary perspective view of a non-volatile memory system according to some embodiments. For convenience of explanation, components that are the same as those described with reference to FIGS. 1 to 16 will be briefly described or their descriptions will be omitted.

Referring to FIG. 21, the electronic system 2000 according to an exemplary embodiment of the present disclosure includes a main board 2001, a controller 2002 mounted on the main board 2001, one or more semiconductor packages 2003, and a DRAM 2004. The semiconductor package 2003 and the DRAM 2004 are connected to the controller 2002 by wiring patterns 2005 formed on the main board 2001.

In an embodiment, the main board 2001 includes a connector 2006 that includes a plurality of pins coupled to an external host. The number and arrangement of the plurality of pins in the connector 2006 varies depending on the communication interface between the electronic system 2000 and the external host. In some embodiments, the electronic system 2000 communicates with an external host according to one of an interface such as an M-Phy for a USB (Universal Serial Bus), a PCI-Express (Peripheral Component Interconnect Express), a SATA (Serial Advanced Technology Attachment), or a UFS (Universal Flash Storage). In some embodiments, the electronic system 2000 is operated by power received from an external host through the connector 2006. The electronic system 2000 further includes a PMIC (Power Management Integrated Circuit) that distributes the power received from the external host to the controller 2002 and the semiconductor package 2003.

In an embodiment, the controller 2002 can record data in the semiconductor package 2003 or read data from the semiconductor package 2003, and can increase the operating speed of the electronic system 2000.

In an embodiment, the DRAM 2004 is a buffer memory that alleviates speed differences between the semiconductor package 2003, which is a data storage space, and the external host. The DRAM 2004 in the electronic system 2000 can also operate as a cache memory, and can provide space for temporarily storing data in control operations of the semiconductor package 2003. When the DRAM 2004 is included in the electronic system 2000, the controller 2002 further includes a DRAM controller that controls the DRAM 2004, in addition to a NAND controller that controls the semiconductor package 2003.

In an embodiment, the semiconductor package 2003 includes first and second semiconductor packages 2003*a* and 2003*b* that are spaced apart from each other. The first and second semiconductor packages 2003*a* and 2003*b* each include a plurality of semiconductor chips 2200. Each of the first and second semiconductor packages 2003*a* and 2003*b* includes a package substrate 2100, semiconductor chips 2200 on the package substrate 2100, adhesive layers 2300 placed on the lower surfaces of the each semiconductor chip 2200, a connection structure 2400 that electrically connects the semiconductor chips 2200 and the package substrate 2100, and a molding layer 2500 that covers the semiconductor chips 2200 and the connection structure 2400 on the package substrate 2100.

In an embodiment, the package substrate 2100 is a printed circuit board that includes package upper pads 2130. Each semiconductor chip 2200 includes an input/output pad 2210. Here, the input/output pad 2210 is the chip pad CP described with reference to FIGS. 1 to 20. Each of the semiconductor chips 2200 includes gate stacking structures 3210 and memory channel structures 3220. Each of the semiconductor chips 2200 includes the semiconductor chip SC described above with reference to FIGS. 1 to 20.

In some embodiments, the connection structure 2400 is a bonding wire that electrically connects the input/output pad 2210 and the package upper pads 2130. Therefore, in each of the first and second semiconductor packages 2003a and 2003b, the semiconductor chips 2200 are electrically connected to each other by the bonding wires, and are electrically connected to the package upper pads 2130 of the package substrate 2100. According to embodiments, in each of the first and second semiconductor packages 2003a and 2003b, the semiconductor chips 2200 are also electrically connected to each other by a connection structure that includes a through silicon via (TSV), in place of the bonding wire connection structure 2400.

In some embodiments, the controller 2002 and the semiconductor chips 2200 are included in a single package. In an embodiment, the controller 2002 and the semiconductor chips 2200 are mounted on an interposer substrate that differs from the main board 2001, and the controller 2002 and the semiconductor chips 2200 are also connected to each other by wiring formed on the interposer substrate.

Figure 22:
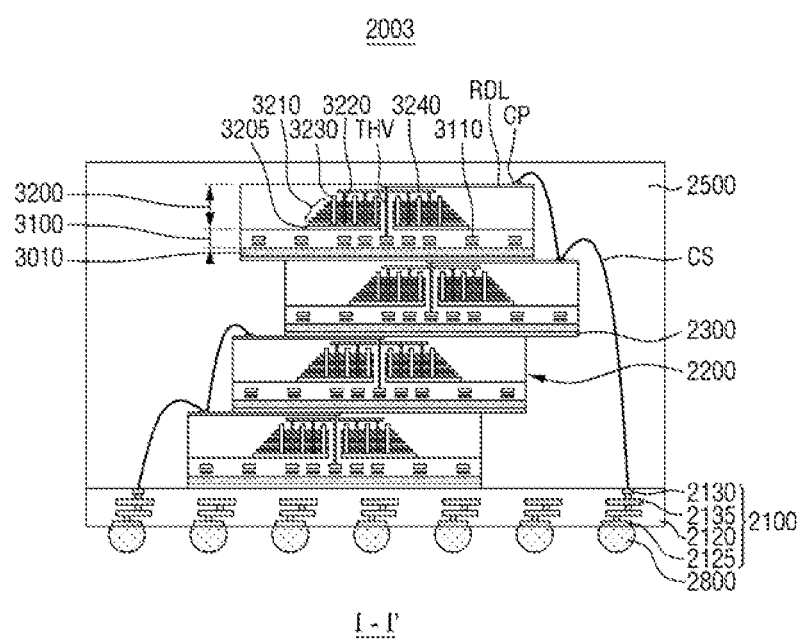
FIG. 22 is a cross-sectional view of a non-volatile memory package of FIG. 21 taken along a line I-I'.
Figure 23:
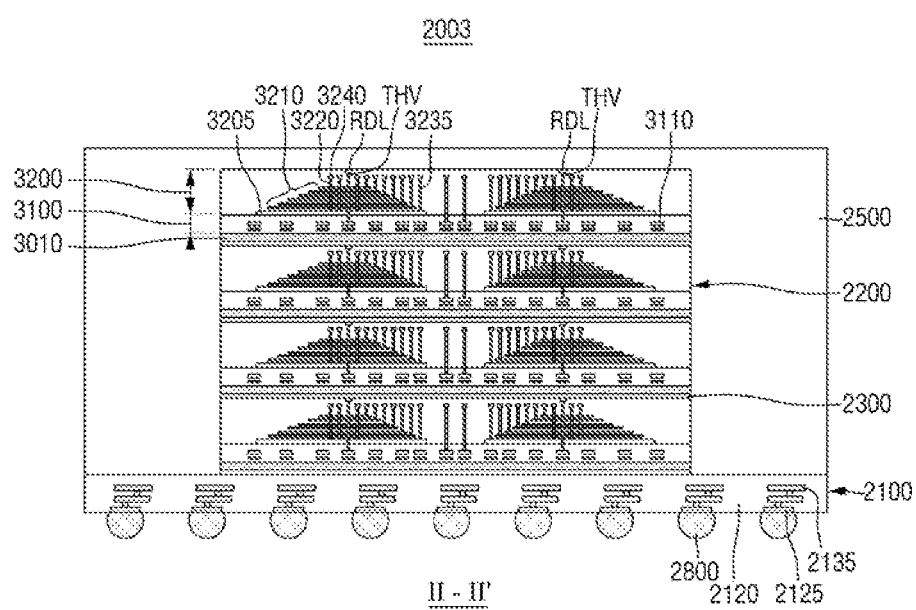
FIG. 23 is a cross-sectional view of a non-volatile memory package of FIG. 21 taken along a line II-II'.

FIG. 22 is a cross-sectional view of a non-volatile memory package of FIG. 21 taken along a line I-I'. FIG. 23 is a cross-sectional view of a non-volatile memory package of FIG. 21 taken along a line II-II'.

Referring to FIGS. 22 and 23, in an embodiment, a semiconductor package 2003 has a COP structure. That is, the semiconductor chip 2200 of the semiconductor package 2003 is a semiconductor package PKG that has a COP structure described with reference to FIGS. 1 to 18.

In a semiconductor package 2003 according to an embodiment, the package substrate 2100 is a printed circuit board. The package substrate 2100 includes a package substrate body portion 2120, package upper pads 2130 placed on the upper surface of the package substrate body portion 2120, lower pads 2125 placed on the lower surface of the package substrate body portion 2120 or exposed through the lower surface, and internal wirings 2135 that electrically connect the upper pads 2130 and the lower pads 2125 inside the package substrate body portion 2120. The upper pads 2130 are electrically connected to the connection structures CS. The lower pads 2125 are connected to the wiring patterns 2005 of the main board 2010 of the electronic system 2000 through conductive connections 2800.

In an embodiment, each of the semiconductor chips 2200 includes a semiconductor substrate 3010, and a first structure 3100 and a second structure 3200 that are sequentially stacked on the semiconductor substrate 3010. The first structure 3100 includes a peripheral circuit region that includes peripheral wirings 3110. The second structure 3200 includes a common source line 3205, a gate stacking structure 3210 on the common source line 3205, memory channel structures 3220 and separation structures 3230 that penetrate the gate stacking structure 3210, bit lines 3240 electrically connected to the memory channel structures 3220, and gate connection wirings 3235 electrically connected to the word lines of the gate stacking structure 3210. Each of the semiconductor chips 2200 also includes a through via THV connected to the peripheral circuit region, a redistribution layer RDL connected to the through via and that extends along the upper surface of the semiconductor chip 2200, and a chip pad CP connected to the redistribution layer RDL. The chip pad CP is connected to another chip pad CP and an upper pad 2130 through the connection structure CS.

Figure 24:
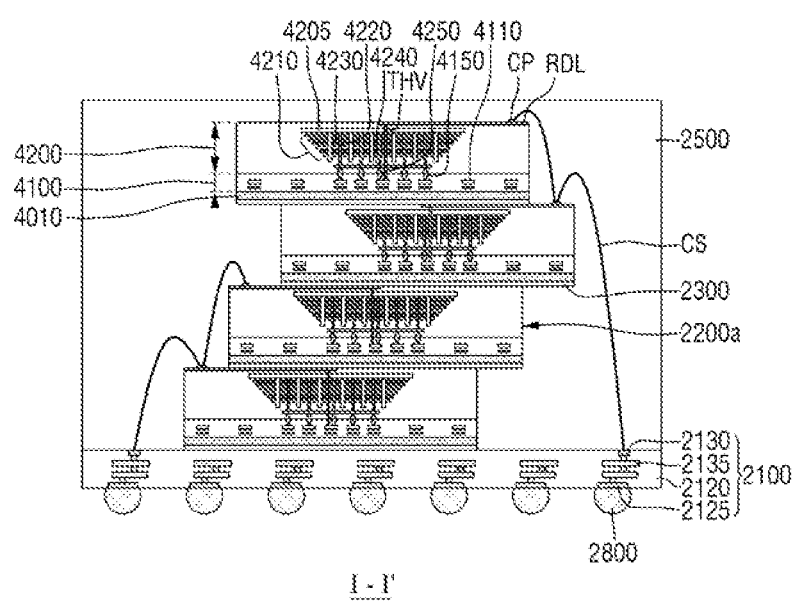
FIG. 24 is a cross-sectional view of a non-volatile memory package of FIG. 21 taken along a line I-I'.
Figure 25:
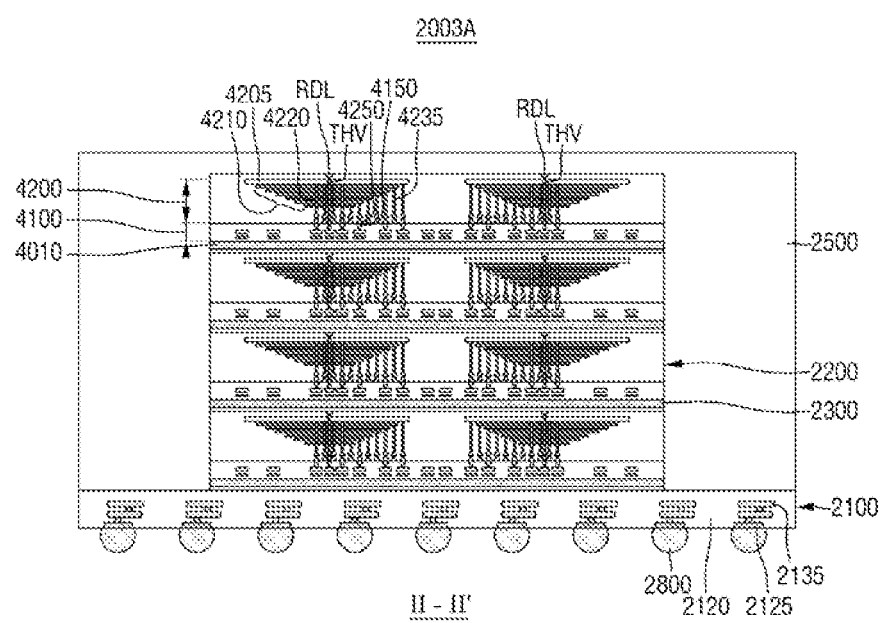
FIG. 25 is a cross-sectional view of a non-volatile memory package of FIG. 21 taken along a line II-II'.

FIG. 24 is a cross-sectional view of a non-volatile memory package of FIG. 21 taken along a line I-I'. FIG. 25 is a cross-sectional view of a non-volatile memory package of FIG. 21 taken along a line II-II'.

Referring to FIGS. 24 and 25, in an embodiment, in a semiconductor package 2003A, each of the semiconductor chips 2200a includes a semiconductor substrate 4010, a first structure 4100 on the semiconductor substrate 4010, and a second structure 4200 that is wafer bonded to the first structure 4100.

In an embodiment, the semiconductor package 2003A has a C2C structure. That is, the semiconductor chip 2200a of the semiconductor package 2003A is a semiconductor package PKG' that has a C2C structure described with reference to FIGS. 19 and 20.

In an embodiment, the first structure 4100 includes a peripheral circuit region that includes a peripheral wiring 4110 and first joining structures 4150. The second structure 4200 includes a common source line 4205, a gate stacking structure 4210 between the common source line 4205 and the first structure 4100, memory channel structures 4220 and a separation structure 4230 that penetrate the gate stacking structure 4210, and second joining structures 4250 that are electrically connected to each of the memory channel structures 4220 and the word lines of the gate stacking structure 4210. For example, the second joining structures 4250 are each electrically connected to the memory channel structures 4220 and the word lines through the bit lines 4240 electrically connected to the memory channel structures 4220 and the gate connection wirings 4235 electrically connected to the word lines. The first joining structures 4150 of the first structure 4100 and the second joining structures 4250 of the second structure 4200 are joined, while being in contact with each other. The joined portions between the first joining structures 4150 and the second joining structures 4250 are formed of, for example, copper (Cu).

In an embodiment, each of the semiconductor chips 2200a includes a through via THV connected to the peripheral circuit region, a redistribution layer RDL connected to the through via and that extends along the upper surface of the semiconductor chip 2200a, and a chip pad CP connected to the redistribution layer RDL. The chip pad CP is connected to another chip pad CP and the upper pad 2130 through the connection structure CS.

In concluding the detailed description, those skilled in the art will appreciate that many variations and modifications may be made to disclosed embodiments without substantially departing from the principles of the present disclosure. Therefore, disclosed embodiments of the disclosure are used in a generic and descriptive sense only and not for purposes of limitation.

What is claimed is:

1. A non-volatile memory chip, comprising:
a cell region that includes
a first surface,
a second surface opposite to the first surface in a second direction,
a cell substrate that includes silicon and is disposed above the first surface,
a cell insulating layer disposed on the cell substrate and below the second surface;
a first cell structure disposed in the cell insulating layer and above the cell substrate in a second direction,
a second cell structure disposed in the cell insulating layer and above the cell substrate in the second direction spaced apart from the first cell structure in a first direction that differs from the second direction; and
a common source line disposed above the cell substrate in the second direction and extending in the first direction;
a peripheral circuit region placed below the first surface of the cell region in the second direction, wherein the peripheral circuit region includes
a peripheral insulating layer below the first surface of the cell region,
a first peripheral circuit disposed in the peripheral insulating layer and connected to the first cell structure,
a second peripheral circuit disposed in the peripheral insulating layer, spaced apart from the first peripheral circuit in the first direction and connected to the second cell structure,
a peripheral substrate disposed below the peripheral insulating layer in the second direction, and
a connection circuit placed in the peripheral substrate between the first and second peripheral circuits;
a through via between the first and second cell structures and that extends from the second surface of the cell region and penetrates through the cell insulating layer, the cell substrate, and the peripheral insulating layer to the connection circuit in the peripheral substrate;
a redistribution layer that covers the through via on the second surface of the cell region, is connected to the through via, and extends along the second surface; and
a chip pad connected to the redistribution layer,
wherein the cell insulating layer and the peripheral insulating layers are spaced apart in the second direction and separated from each other by the cell substrate.

2. The non-volatile memory chip of claim 1, wherein the first cell structure includes
the common source line,
a plurality of word lines above the common source line in the second direction and that extend in the first direction, and
a channel structure that penetrates the plurality of word lines and extends in the second direction and connects to the common source line,
wherein the word lines are spaced apart from the through via in the first direction, and the through via is connected to the common source line.

3. The non-volatile memory chip of claim 2, wherein the plurality of word lines include a first portion, and a second portion opposite to the first portion, and
the word line of the first portion has a stair structure, and the word line of the second portion has a stair structure that is symmetric to the stair structure of the first portion.

4. The non-volatile memory chip of claim 3, wherein the through via is spaced apart from the word line of the first portion and the second portion.

5. The non-volatile memory chip of claim 2, wherein a thickness of the channel structure in the second direction is less than a length of the through via in the second direction.

6. The non-volatile memory chip of claim 2, wherein the through via extends in the second direction, and
the redistribution layer extends in the first direction.

7. The non-volatile memory chip of claim 6, wherein the chip pad is placed at a distal end of the redistribution layer in the first direction.

8. The non-volatile memory chip of claim 1, wherein the redistribution layer overlaps the first peripheral circuit and the first cell structure, and does not overlap the second peripheral circuit and the second cell structure.

9. The non-volatile memory chip of claim 1, wherein the redistribution layer includes a first terminal connected to the through via, and a second terminal opposite to the first terminal, and
the chip pad is placed at the second terminal.

10. The non-volatile memory chip of claim 1, wherein the chip pad does not overlap the through via.

11. The non-volatile memory chip of claim 1, wherein a length of the through via is greater than a thickness of the cell region.

12. The non-volatile memory chip of claim 1, further comprising:
a pre pad that is disposed between the through via and the redistribution layer, and electrically connects the through via and the redistribution layer.

13. A non-volatile memory chip, comprising:
a first region that extend in a first direction;
a second region that is spaced apart in a second direction from the first region, wherein the second direction differs from the first direction;
a cell substrate disposed in the first region and the second region and that includes silicon;
a cell insulating layer disposed in the first region and the second region and above the cell substrate in a third direction that differs from the first and second directions;
a cell structure placed in the cell insulating layer in the second region of the non-volatile memory chip;
a peripheral insulating layer disposed below the cell substrate in the third direction in the first region and the second region;
a common source line disposed above the cell substrate in the third direction and extending in the second direction;
a peripheral circuit placed in the peripheral insulating layer in the second region of the non-volatile memory chip and connected to the cell structure;
a connection circuit placed in the first region of the non-volatile memory chip and connected to the peripheral circuit, and disposed below the cell substrate in the third direction;
peripheral substrate disposed in the first region and the second region below the peripheral insulating layer in the third direction, wherein the connection circuit is disposed in the peripheral substrate;
a through via placed in the first region of the non-volatile memory chip, wherein the through via extends from an upper surface of the non-volatile memory chip through the cell insulating layer, the cell substrate and the peripheral insulating layer and is connected to the connection circuit in the peripheral substrate;

a redistribution layer connected to the through via in the first region and that extends along the upper surface of the second region of the non-volatile memory chip; and a chip pad connected to the redistribution layer in the second region, wherein the cell insulating layer and the peripheral insulating layers are spaced apart in the third direction and separated from each other by the cell substrate.

14. The non-volatile memory chip of claim 13, wherein the redistribution layer extends in the second direction along the upper surface of the first region and the second region of the non-volatile memory chip.

15. The non-volatile memory chip of claim 13, wherein the cell structure has a stair structure, and the through via penetrates the cell structure.

16. The non-volatile memory chip of claim 15, wherein the cell structure includes a first portion adjacent to the through via, and a second portion opposite to the first portion, and the second portion has a stair structure, and the first portion has a stair structure that is symmetric to the stair structure of the first portion.

17. The non-volatile memory chip of claim 13, wherein the peripheral circuit includes a row decoder and a page buffer connected to the cell structure, and the row decoder and the page buffer transmit or receive data through the through via.

18. The non-volatile memory chip of claim 13, wherein the chip pad does not overlap the through via.

19. The non-volatile memory chip of claim 13, further comprising:

a bonding pad formed between the cell structure and the peripheral circuit, wherein the bonding pad electrically connects the cell structure and the peripheral circuit.

20. A non-volatile memory chip, comprising:

a cell region that includes a first surface, a second surface opposite to the first surface, a cell substrate that includes silicon, a cell insulating layer disposed on the cell substrate, a cell structure disposed in the cell insulating layer and that includes a stair structure, and a common source line disposed above the cell substrate in a second direction and extending in a first direction that differs from the second direction;

a peripheral circuit region disposed on the first surface of the cell region, wherein the peripheral circuit region includes a peripheral substrate, a peripheral insulating layer disposed on the peripheral substrate, and a peripheral circuit disposed in the peripheral insulating layer;

a through via that extends from the second surface of the cell region and penetrates the cell structure and the cell substrate and connects to the peripheral circuit;

a redistribution layer that extends along the second surface of the cell region, wherein a first end of the redistribution layer covers the through via and is connected to the through via; and a chip pad that is connected to the redistribution layer and does not overlap the through via, wherein the cell structure includes the common source line, a plurality of word lines above the common source line in a second direction and that extend in the first direction, and a channel structure that penetrates the plurality of word lines and extends in the second direction and connects to the common source line, wherein the word lines are spaced apart from the through via in the first direction, and the common source line is connected to the through via, wherein the cell insulating layer and the peripheral insulating layers are spaced apart in the second direction and separated from each other by the cell substrate.

\* \* \* \* \*